(12) United States Patent
Abad et al.

(10) Patent No.: US 11,294,352 B2
(45) Date of Patent: Apr. 5, 2022

(54) CROSS-SECTION IDENTIFICATION SYSTEM

(71) Applicant: THE BOEING COMPANY, Chicago, IL (US)

(72) Inventors: Samir Abad, Bellevue, WA (US); Sucheth Misquith, Everett, WA (US); Sameer Kate, Bothell, WA (US); Linza Varghese, Mysuru (IN); Maher James Chinnathurai, Everett, WA (US)

(73) Assignee: The Boeing Company, Chicago, IL (US)

( * ) Notice: Subject to any disclaimer, the term of this patent is extended or adjusted under 35 U.S.C. 154(b) by 125 days.

(21) Appl. No.: 16/857,720

(22) Filed: Apr. 24, 2020

(65) Prior Publication Data

US 2021/0333777 A1 Oct. 28, 2021

(51) Int. Cl.

| | | |
|---|---|---|
| G06T 11/20 | (2006.01) | |
| G06T 17/00 | (2006.01) | |
| G06T 1/00 | (2006.01) | |
| G05B 19/4099 | (2006.01) | |
| G05B 19/19 | (2006.01) | |
| G06T 11/00 | (2006.01) | |
| G06F 30/00 | (2020.01) | |
| G06F 30/10 | (2020.01) | |
| G06T 17/30 | (2006.01) | |

(52) U.S. Cl.
CPC ......... *G05B 19/4099* (2013.01); *G05B 19/19* (2013.01); *G06F 30/00* (2020.01); *G06F 30/10* (2020.01); *G06T 1/00* (2013.01); *G06T 11/00* (2013.01); *G06T 11/203* (2013.01); *G06T 17/00* (2013.01); *G06T 17/30* (2013.01)

(58) Field of Classification Search
None
See application file for complete search history.

(56) References Cited

U.S. PATENT DOCUMENTS

| | | | | |
|---|---|---|---|---|
| 5,455,897 A | * | 10/1995 | Nicholl | G06T 11/40 |
| | | | | 345/443 |
| 5,586,232 A | * | 12/1996 | Yoshida | G06T 17/00 |
| | | | | 345/427 |
| 2008/0309676 A1 | * | 12/2008 | Nehab | G06T 9/00 |
| | | | | 345/582 |

(Continued)

*Primary Examiner* — Joni Hsu
(74) *Attorney, Agent, or Firm* — Womble Bond Dickinson (US) LLP

(57) ABSTRACT

A method is provided for defining a cross section having an arbitrary shape. The method includes creating a vector graphic of the cross section. The method includes disassembling the vector graphic of the cross section into paths that represent an outline of the arbitrary shape of the cross section, each path a straight path or a curved path having respective endpoints including a first endpoint and a second endpoint. The method includes arranging the paths in an order in which the paths are connected in the vector graphic to form the outline of the arbitrary shape of the cross section, and generating an array of elements for the paths, including elements for successive pairs of adjacent straight paths in the order in which the paths are arranged. And the method incudes defining and thereby producing a definition of the cross section from the array of elements.

24 Claims, 27 Drawing Sheets

(56) References Cited

U.S. PATENT DOCUMENTS

2011/0122139 A1\* 5/2011 Lee .................. G06T 11/203
 345/441
2012/0242693 A1\* 9/2012 Hamada ................ G06T 1/00
 345/629
2017/0286567 A1\* 10/2017 Hana .................. B33Y 50/00

\* cited by examiner

CROSS-SECTION IDENTIFICATION SYSTEM

TECHNOLOGICAL FIELD

The present disclosure relates generally to design and engineering of structures such as aircraft parts and, in particular, to defining and dimensioning a cross section of a structure.

BACKGROUND

In the manufacturing industry, structural design and stress engineers often use cross section dimension measurements for a number of different purposes. For example, engineers may use cross section dimension measurements to verify design changes and/or updates. Calculations of section properties may be used for section analysis. Pictorial captures of section dimensions may be used for strength check notes (SCN).

Currently, a number of manual and automated solutions exist for dimensioning cross sections of a structure, but both solutions suffer from a number of issues. Existing manual solutions are often time consuming (longer flowtime) and error prone, particularly for some complex products that require thousands of cross sections. Existing automated solutions are point solutions that only work for intended cross section shapes, and often require extensive rework for even the most minor changes in shape (shapes with holes, rotated shapes, etc.).

Therefore it would be desirable to have a system and method that takes into account at least some of the issues discussed above, as well as other possible issues.

BRIEF SUMMARY

Example implementations of the present disclosure are directed to design and engineering of structures such as aircraft parts and, in particular, to defining and dimensioning a cross section of a structure. Example implementations provide a generic cross section dimensioning process that may enable automated section cuts, defining and dimensioning. Example implementations are suitable for a variety of structures including those including composite parts, metallic parts or the like. According to example implementations, cross section dimensions—or locations from which to dimension—may be stored in a repository, which can be queried downstream for analytics. An engineer may be enabled to replicate dimensioning from pre-defined templates, and can invoke a batch mode for many cross sections. Example implementations further account for variation in the shape of a cross section, including cross sections that include holes, as well as those that are rotated.

The present disclosure thus includes, without limitation, the following example implementations.

Some example implementations provide a method of defining a cross section of a structure, the cross section having an arbitrary shape, the method comprising creating a vector graphic of the cross section in a two-dimensional (2D) space in which points are specified by numerical coordinates; disassembling the vector graphic of the cross section into paths that represent an outline of the arbitrary shape of the cross section, each path a straight path or a curved path having respective endpoints including a first endpoint and a second endpoint; arranging the paths in an order in which the paths are connected in the vector graphic to form the outline of the arbitrary shape of the cross section; generating an array of elements for the paths, including elements for successive pairs of adjacent straight paths in the order in which the paths are arranged, each element indicating for a respective one of the successive pairs, including a first straight path and an adjacent, second straight path, whether the numerical coordinates of the second endpoint of the second straight path are decreasing or increasing with respect to the numerical coordinates of the first endpoint of the first straight path; and defining and thereby producing a definition of the cross section from the array of elements.

In some example implementations of the method of any preceding example implementation, or any combination of any preceding example implementations, disassembling the vector graphic includes removing from the paths, at least one duplicate path that shares the respective endpoints with another of the paths.

In some example implementations of the method of any preceding example implementation, or any combination of any preceding example implementations, creating the vector graphic includes creating a computer file having a vector image format in which the vector graphic encoded for storage in the computer file, the vector graphic defined by specific points in the 2D space and commands to draw the paths between the specific points, and wherein disassembling the vector graphic includes differentiating the paths as straight paths and any curved paths, based on the specific points and commands by which the vector graphic is defined.

In some example implementations of the method of any preceding example implementation, or any combination of any preceding example implementations, differentiating the paths includes identifying those of the paths as straight paths formed of a single line drawn from only one of a command to draw a line from a current specific point to a given specific point, or formed of multiple lines drawn from multiple successive ones of the command in which an angle between a first number of multiple lines and a last number of the multiple lines is less than or equal to a threshold.

In some example implementations of the method of any preceding example implementation, or any combination of any preceding example implementations, differentiating the paths includes identifying those of the paths as curved paths formed of multiple lines drawn from multiple successive ones of a command to draw a line from a current specific point to a given specific point, in which an angle between a first number of multiple lines and a last number of the multiple lines is greater than a threshold.

In some example implementations of the method of any preceding example implementation, or any combination of any preceding example implementations, arranging the paths includes identifying one of the paths as a first path in the order; and performing an iterative process to arrange others of the paths after the first path in the order, connected to one another in the vector graphic, a first iteration including: locating for a current path in the order that in the first iteration is the first path, a connected path in the vector graphic, including iteratively comparing the respective endpoints of the current path with those of others of the paths to identify one of the respective endpoints of the connected path that matches one of the respective endpoints of the current path; and arranging the connected path after the current path in the order, wherein in each of at least some iterations of the iterative process after the first iteration, the current path is the connected path located in an immediately preceding iteration.

In some example implementations of the method of any preceding example implementation, or any combination of any preceding example implementations, generating the array of elements includes generating the array of elements further including elements for any curved paths in the order in which the paths are arranged, and that indicate those of the paths that are curved paths.

In some example implementations of the method of any preceding example implementation, or any combination of any preceding example implementations, generating the array of elements includes generating a circular array of the elements.

Some example implementations provide an apparatus for defining a cross section of a structure, the cross section having an arbitrary shape, the apparatus comprising a memory configured to store computer-readable program code; and processing circuitry configured to access the memory, and execute the computer-readable program code to cause the apparatus to at least perform the method of any preceding example implementation, or any combination of any preceding example implementations.

Some example implementations provide a computer-readable storage medium for defining a cross section of a structure, the cross section having an arbitrary shape, the computer-readable storage medium being non-transitory and having computer-readable program code stored therein that, in response to execution by processing circuitry, causes an apparatus to at least perform the method of any preceding example implementation, or any combination of any preceding example implementations.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

FIG. 1 illustrates a system for defining and dimensioning a cross section of a structure, according to some example implementations of the present disclosure;

FIGS. 2 and 3 more particularly illustrate respectively a define engine and dimensioning engine of the system of FIG. 1, according to some example implementations;

4A and 4B illustrate respectively a solid model of a seat track, and a cross section of the seat track, according to some example implementations;

DETAILED DESCRIPTION

Figure 1:
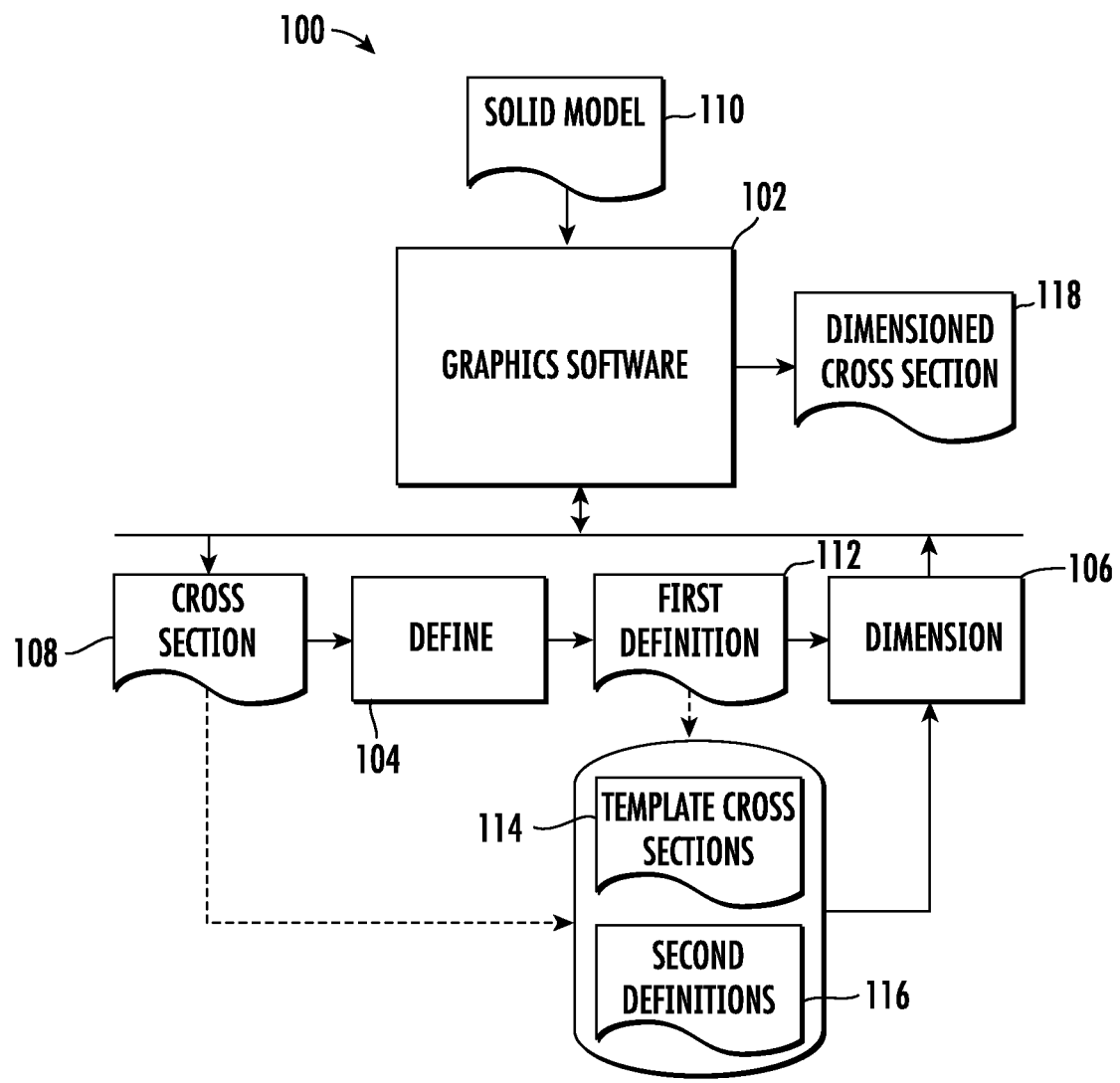

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure relate generally to design and engineering of structures and, in particular, to defining and dimensioning a cross section of a structure. Example implementations may be particularly useful in the manufacturing industry, such as in the manufacture of aircraft or aircraft parts. It should be understood, however, that example implementations are equally applicable to other structures. Examples of suitable structures include vehicles and vehicle parts, such as spacecraft, watercraft, motor vehicles, railed vehicles and the like. Furthermore, it should be understood that unless otherwise specified, the terms "data," "content," "digital content," "information," and similar terms may be at times used interchangeably.

FIG. 1 illustrates a system 100 for defining and dimensioning a cross section of a structure such as an aircraft part, according to example implementations of the present disclosure. The system may include any of a number of different subsystems (each an individual system) for performing one or more functions or operations. As shown, in some examples, the system includes graphics software 102 such as computer-aided design (CAD) software, a define engine 104 and a dimensioning engine 106. The subsystems including the graphics software, define engine and dimension module may be co-located or directly coupled to one another, or in some examples, various ones of the subsystems may communicate with one another across one or more computer networks. Further, although shown as part of the system, it should be understood that any one or more of the above may function or operate as a separate system without regard to any of the other subsystems. It should also be understood that the system may include one or more additional or alternative subsystems than those shown in FIG. 1.

The graphics software 102 is generally configured to create or otherwise provide a cross section 108 of the structure. In some examples in which the graphics software is or includes CAD software, the CAD software is configured to create the cross section from a solid model 110 of the structure. The define engine 104 is generally configured to define and thereby produce a first definition 112 of the cross section, more simply referred to in some examples as a definition. The dimensioning engine 106 is generally configured to identify a matching one of a number of template cross sections 114 based on the first definition and respective second definitions 116 of the template cross sections. The matching one of the template cross sections has respective locations from which the matching one of the template cross sections is dimensioned, and the dimensioning engine is configured to apply the respective locations to the cross section. In some examples, the dimensioning engine is further configured to dimension the cross section from the respective locations, and thereby produce a dimensioned cross section 118. In other examples, the cross section is dimensioned by the graphics software (e.g., the CAD software), from the respective locations.

Figure 2:
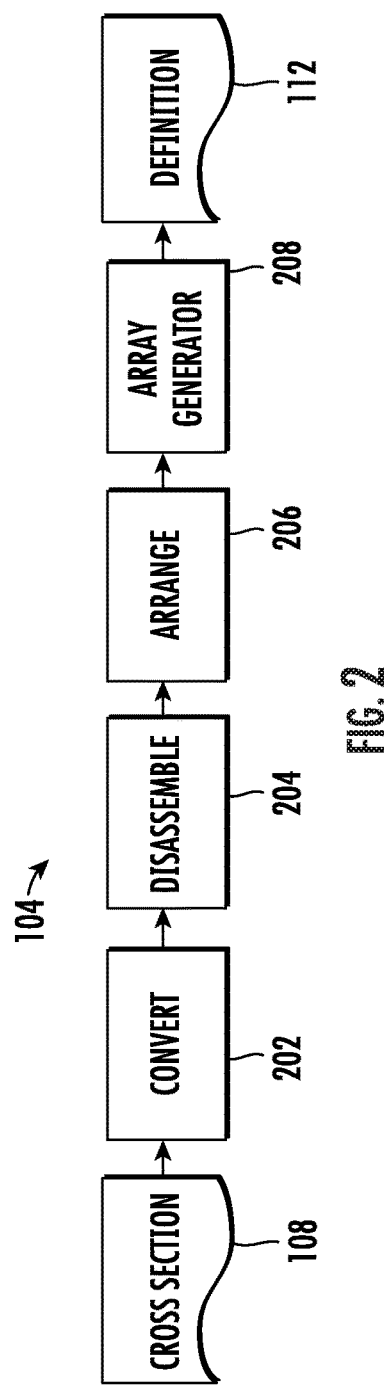
Figure 3:
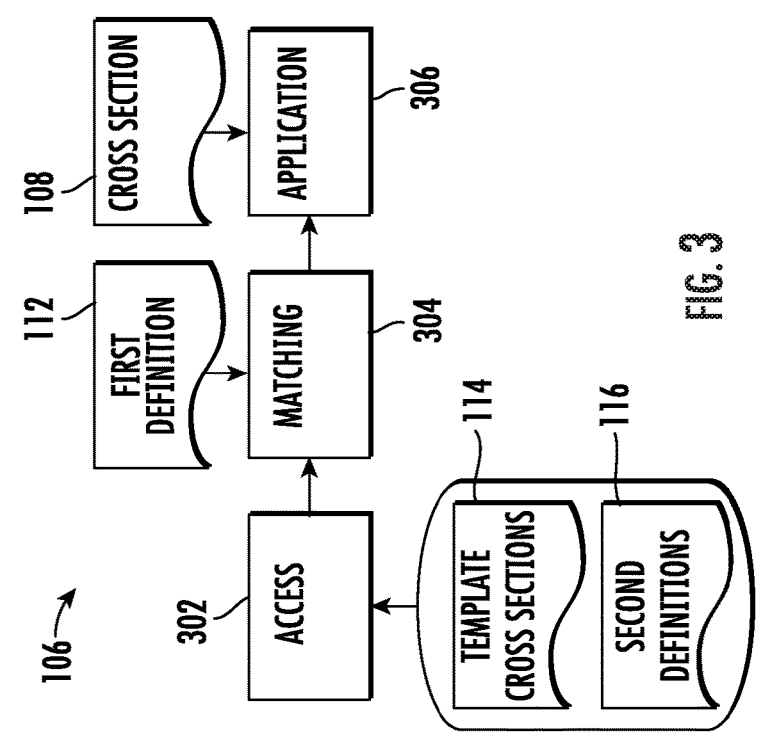

FIGS. 2 and 3 more particularly illustrate respectively the define engine 104 and the dimensioning engine 106 of the system of FIG. 1, according to some example implementations. As with the system, the define engine and the dimensioning engine may themselves include any of a number of different subsystems (each an individual system) for performing one or more functions or operations. The subsystems may be co-located or directly coupled to one another, or in some examples, various ones of the subsystems may communicate with one another across one or more computer networks. Further, although shown as part of the define engine and dimensioning engine, it should be understood that any one or more of the subsystems may function or operate as a separate system without regard to any of the other subsystems. It should also be understood that the define engine and/or dimensioning engine may include one or more additional or alternative subsystems than those shown in FIGS. 2 and 3.

As shown in FIG. 2, for example, the define engine 104 includes subsystems such as a convert module 202, a disassemble module 204, an arrange module 206, and an array generator 208. In accordance with example implementations, the convert module 202 of the define engine 104 is configured to create a vector graphic of the cross section 108 in a two-dimensional (2D) space in which points are specified by numerical coordinates. In other examples, the vector graphic may be created by the graphics software 102 and supplied to the define engine, which may not itself include a distinct convert module. In some examples, creation of the vector graphic includes creation of a computer file having a vector image format in which the vector graphic encoded for storage in the computer file. In these examples, the vector graphic is defined by specific points in the 2D space and commands to draw the paths between the specific points. One example of a suitable format is the Scalable Vector Graphics (SVG) format.

In some more particular examples in which the graphics software 102 is or includes CAD software, and the cross section 108 is created from a solid model 110, a cutting plane is created at a particular location on the solid model where the cross section should be extracted. The cross section is then created at the particular location so that the cutting plane contains the cross section, using an "intersection" or "sectioning" process in the CAD software. A drawing view may be created from the cross section, which may then be exported in a vector graphic (e.g., SVG) format.

The disassemble module 204 is configured to disassemble the vector graphic of the cross section 108 into paths that represent an outline of the arbitrary shape of the cross section, where each path is a straight path or a curved path having respective endpoints including a first endpoint and a second endpoint. In some examples, this includes the disassemble module configured to remove from the paths, at least one duplicate path that shares the respective endpoints with another of the paths.

In some examples in which the vector graphic is defined by specific points in the 2D space and commands to draw the paths between the specific points, the disassemble module 204 is configured to differentiate the paths as straight paths and any curved paths, based on the specific points and commands by which the vector graphic is defined. In some further examples, straight paths include those paths formed of a single line drawn from only one of a command to draw a line from a current specific point to a given specific point, or formed of multiple lines drawn from multiple successive ones of the command in which an angle between a first number of multiple lines and a last number of the multiple lines is less than or equal to a threshold. Additionally or alternatively, in some examples, curved paths include those paths formed of multiple lines drawn from multiple successive ones of a command to draw a line from a current specific point to a given specific point, in which an angle between a first number of multiple lines and a last number of the multiple lines is greater than a threshold.

The arrange module 206 is configured to arrange the paths in an order in which the paths are connected in the vector graphic to form the outline of the arbitrary shape of the cross section 108.

In some examples, the arrange module 206 is configured to identify one of the paths as a first path in the order, and perform an iterative process to arrange others of the paths after the first path in the order, connected to one another in the vector graphic of the cross section 108. In these examples, a first iteration includes the arrange module configured to locate for a current path in the order that in the first iteration is the first path, a connected path in the vector graphic. This includes the arrange module configured to iteratively compare the respective endpoints of the current path with those of others of the paths to identify one of the respective endpoints of the connected path that matches one of the respective endpoints of the current path. The first iteration also includes the arrange module configured to arrange the connected path after the current path in the order. In each of at least some iterations of the iterative process after the first iteration, then, the current path is the connected path located in an immediately preceding iteration.

The array generator 208 is configured to generate an array of elements for the paths such as a circular array of the elements, and define and thereby produce a first definition 112 of the cross section 108 from the array of elements. The array of elements includes elements for successive pairs of adjacent straight paths in the order in which the paths are arranged. Each element indicates for a respective one of the successive pairs, including a first straight path and an adjacent, second straight path, whether the numerical coordinates of the second endpoint of the second straight path are decreasing or increasing with respect to the numerical coordinates of the first endpoint of the first straight path. In some examples, the array of elements further includes elements for any curved paths in the order in which the paths are arranged, and that indicate those of the paths that are curved paths.

Briefly returning to FIG. 1, the cross section 108 in some examples defines a hole through the structure that is parallel with a cutting plane that contains the cross section. In some of these examples, the define engine 104 is further configured to close the hole in the vector graphic of the cross section before the first definition 112 is produced. In particular, in some examples in which the hole is represented in the cross section by parallel straight paths in the vector graphic, the define engine is configured to join the parallel straight paths in the vector graphic with additional straight paths that are parallel with one another, and that are perpendicular to the parallel straight paths. The define engine is then configured to remove the parallel straight paths from the vector graphic.

Now turning to FIG. 3, in some examples, the dimensioning engine 106 includes subsystems such as an access module 302, a matching module 304, and an application module 306. The access module is configured to access template cross sections 114 of various shapes, the template cross sections having respective second definitions 116. These second definitions may be similar to the first definition 112 of the cross section 108, and may even be produced by the define engine 104 for the template cross sections, such as in a manner similar to that described above. In some examples, then, the define engine is configured to define and thereby produce the definitions, which may be accessed by the access module.

More particularly, according to example implementations, the cross section 108 and template cross sections 114 are vector graphics, and each of the first definition 112 and the second definitions 116 includes an array of elements for paths of a respective one of the vector graphics. The elements include elements for successive pairs of adjacent straight paths in an order in which the paths are connected. For these elements, each element indicates for a respective one of the successive pairs, whether numerical coordinates of a second endpoint of a second straight path are decreasing or increasing with respect to the numerical coordinates of a first endpoint of a first straight path.

The matching module 304 is configured to perform a comparison of the first definition 112 of the cross section and the respective second definitions 116 of the template cross sections 114. The matching module is also configured to identify a matching one of the template cross sections based on the comparison. In some examples, an otherwise matching one of the template cross sections 114 may be rotated relative to the cross section 108. In these examples, the matching module 304 may be configured to perform its comparison iteratively on rotated versions of the template cross section.

In particular, consider a template cross section of the template cross sections 114 having a second definition of the respective second definitions 116, and perhaps also in which the template cross section is a vector graphic of the vector graphics. In some examples, the matching module 304 is configured to perform a comparison of the first definition 112 of the cross section 108 and the second definition of the template cross section. Responsive to a failure to match the first definition and the second definition based on the comparison, the matching module is configured to identify angles between straight paths in the cross section and the template cross section. The matching module is then configured to perform an iterative comparison of the first definition of the cross section and respective third definitions of rotated versions of the template cross section based on the angles. In these examples, the iterative comparison is performed until a matching one of the rotated versions of the template cross section is identified, or the first definition fails to match any of the respective third definitions of rotated versions of the template cross section.

In some further examples, the iterative comparison includes for an iteration, the matching module 304 configured to rotate the vector graphic of the template cross section by an angle of the angles and thereby produce a rotated version of the template cross section. The matching module is configured to define and thereby produce a third definition of the rotated version of the cross section. And the matching module is configured to perform a comparison of the first definition 112 of the cross section 108 and the third second definition of the rotated version of the template cross section.

The template cross sections 114 have locations from which the respective ones of the template cross sections are dimensioned. Accordingly, the matching one of the template cross sections further has respective locations from which the matching one of the template cross sections is dimensioned. The application module 306 is configured to apply the respective locations to the cross section 108. The cross section is then dimensioned from the respective locations to produce the dimensioned cross section 118. In some examples, the graphics software 102 is configured to dimension the cross section from the respective locations. In other examples, the dimensioning engine 106 additionally includes a dimensioning module configured to dimension the cross section from the respective locations.

Figure 4A:
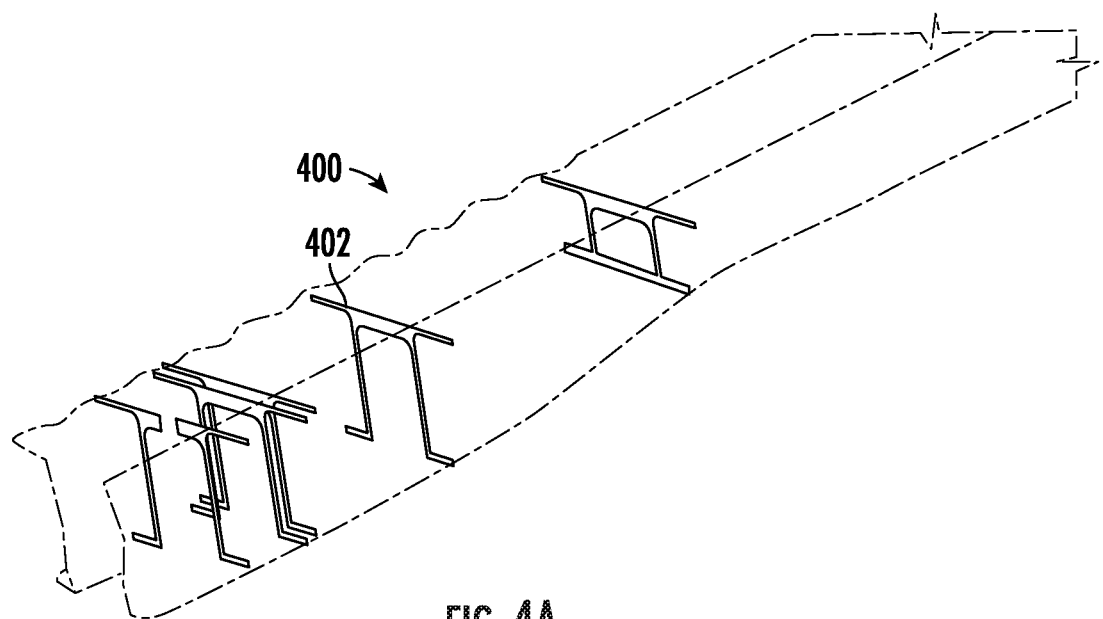
Figure 4B:
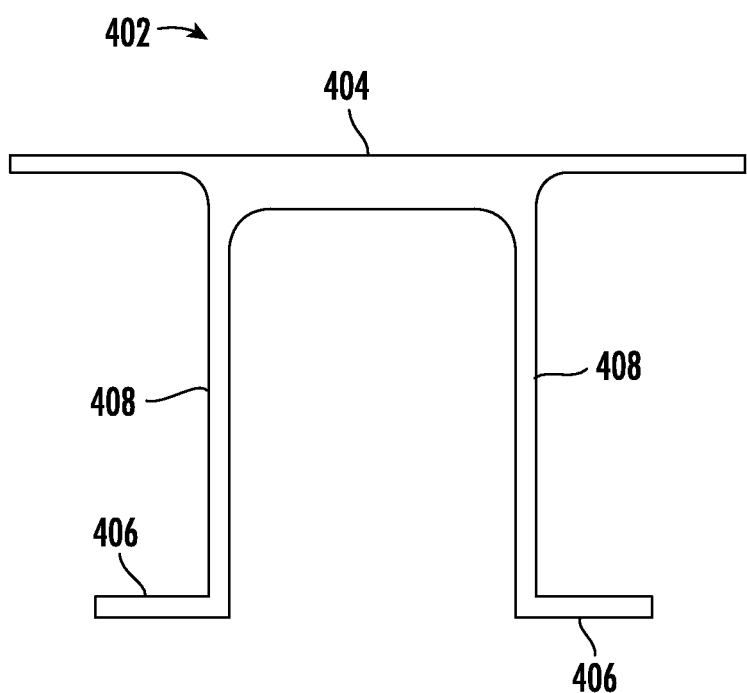

To further illustrate example implementations of the present disclosure, FIGS. 4A and 4B illustrate a solid model 400 of a seat track (structure), and a cross section 402 of the seat track, which may correspond to respectively the solid model 110 and cross section 108 in FIG. 1. As shown in the cross section, the seat track may include an upper flange 404 connected to lower flanges 406 by respective webs 408. As explained above, the convert module 202 of the define engine 104 is configured to create a vector graphic of the cross section in a 2D space in which points are specified by numerical coordinates, which may be denoted by the letters x and y.

Further consider a computer file having a vector image format in which the vector graphic of the cross section 402 is encoded for storage in the computer file. The vector graphic is defined by specific points (x, y) in the 2D space and commands to draw the paths between the specific points. In the SVG format, examples of commands include the following:

| Command | Name |
| --- | --- |
| A | elliptical arc |
| C | curveto |
| H | horizontal lineto |

-continued

| Command | Name |
|---------|------|
| L | lineto |
| M | moveto |
| Q | quadratic Bezier curve |
| S | smooth curveto |
| T | smooth quadratic Bezier curveto |
| V | vertical lineto |
| Z | closepath |

Figure 5:
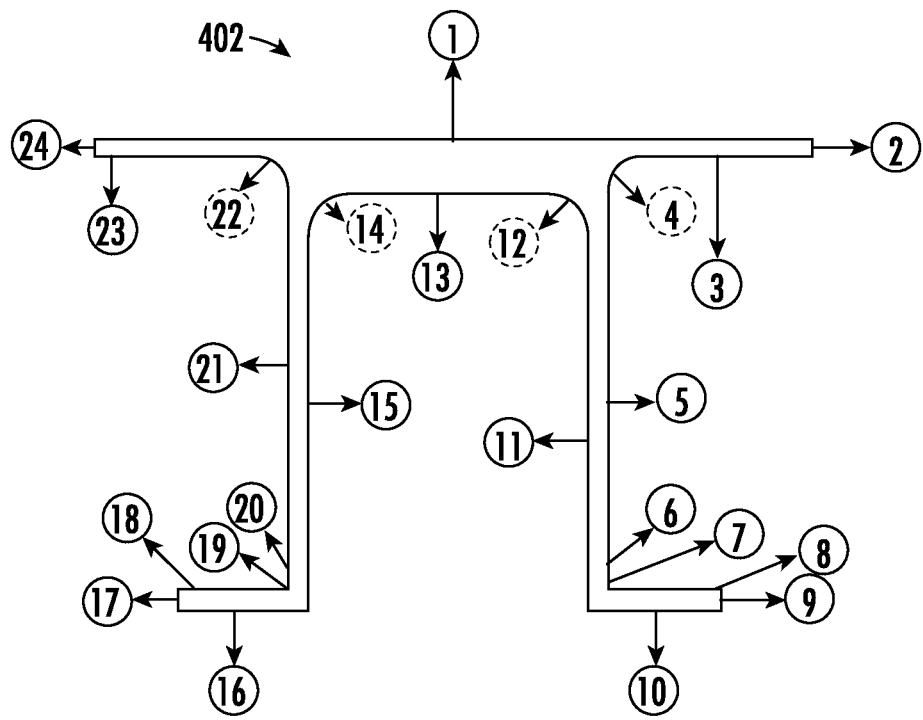
FIGS. 5, 6, 7, 8, 9, 10, 11 and 12 illustrate defining the cross section of the seat track in FIG. 4B, according to some example implementations.

The disassemble module 204 is configured to disassemble the vector graphic of the cross section 402 into paths that represent an outline of the arbitrary shape of the cross section, where each path is a straight path or a curved path having respective endpoints including a first endpoint and a second endpoint. FIG. 5 illustrates the cross section 402 including twenty-four paths. As illustrated, paths 1-3, 5-11, 13, 15-21, 23 and 24 are straight paths, and the remaining paths 4, 12, 14 and 22 are curved paths.

Figure 6:
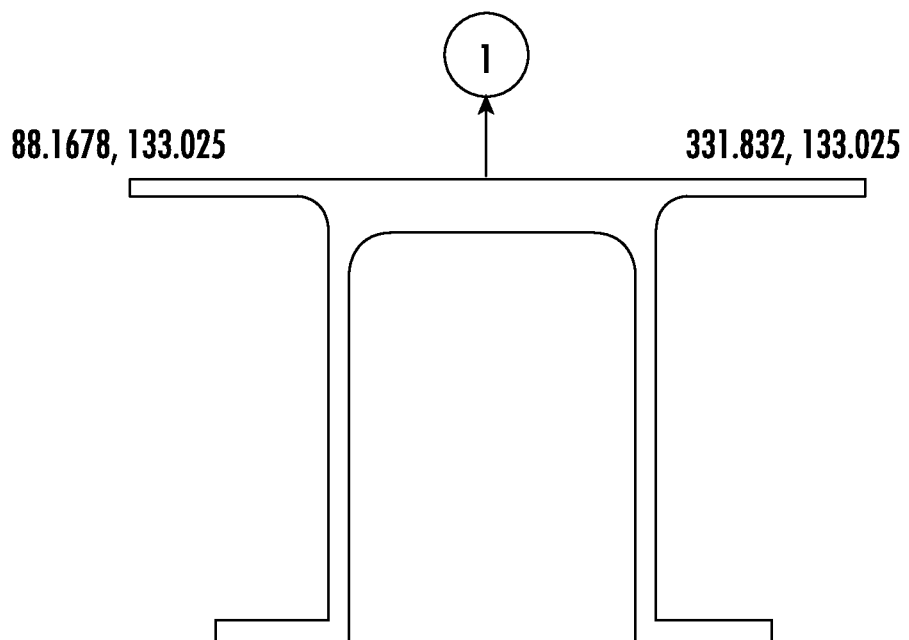

In some examples, disassembly of the vector graphic of the cross section 402 includes the disassemble module 204 is configured to remove from the paths, at least one duplicate path that shares the respective endpoints with another of the paths. In particular, for example, take path 1 from the collection of twenty-four paths shown in FIG. 5, which may be drawn according to the command: M88.1678, 133.025 L331.832, 133.025, as shown in FIG. 6. Identify the x, y coordinates from this path. Find $x_1$, $y_1$ from respectively the first and second arguments of the M command, i.e., 88.1678 and 133.025. Similarly, find $x_2$, $y_2$ from respectively the first and second arguments of the L command, i.e., 331.832 and 133.025. Others of the twenty-four paths may then be checked for any other path that has the same $x_1$, $y_1$ and $x_2$, $y_2$. If present, the other path may be removed from the paths for the vector graphic. This may then be repeated for paths 2-24.

Figure 7:
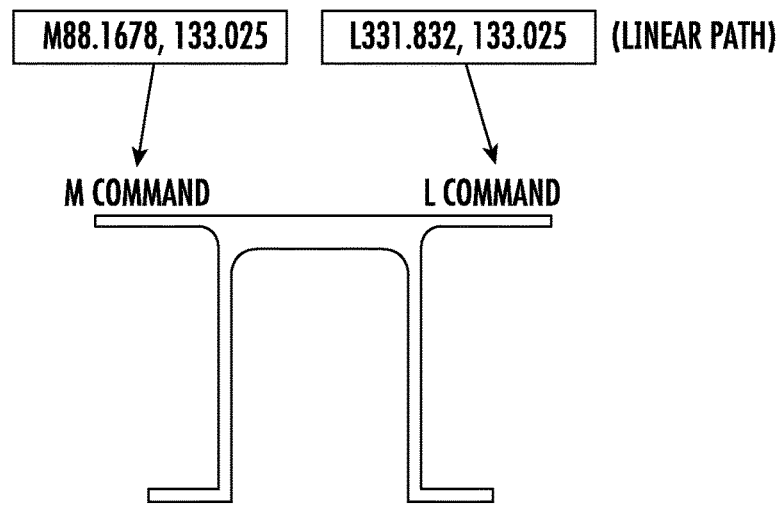

In some examples in which the vector graphic is defined by specific points in the 2D space and commands to draw the paths between the specific points, the disassemble module 204 is configured to differentiate the paths as straight paths and any curved paths, based on the specific points and commands by which the vector graphic is defined. As shown in FIG. 7, for example, straight paths may include those paths formed of a single line drawn from only one of a command to draw a line from a current specific point to a given specific point.

The straight paths may also include those paths formed of multiple lines drawn from multiple successive ones of the command in which an angle between a first number of multiple lines and a last number of the multiple lines is less than or equal to a threshold. Conversely, curved paths may include those paths formed of multiple lines drawn from multiple successive ones of a command to draw a line from a current specific point to a given specific point, in which an angle between a first number of multiple lines and a last number of the multiple lines is greater than a threshold.

Figure 8:
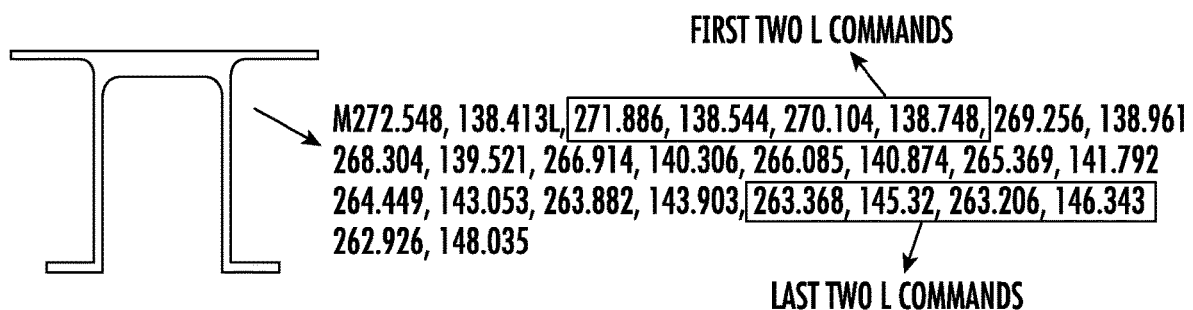

As shown in FIG. 8 for path 4 of the vector graphic of the cross section 402, a line $L_1$ may be created between the first two L commands 271.886, 138.544 and 270.104, 138.748, and a line $L_2$ may be created between the last two L commands 263.206, 146.343 and 262.926, 148.035. That is, a line $L_1$ may be created with $x_1$=271.886, $y_1$=138.544 and $x_2$=270.104, $y_2$=138.748; and a line $L_2$ may be created with $x_1$=263.206, $y_1$=146.343 and $x_2$=262.926, $y_2$=148.035. Find the angle between $L_1$ and $L_2$. If the angle is less than or equal to a threshold such as 5°, the path may be considered a straight path. But if the angle is greater than the threshold, the path may be considered a curved path. In the example shown in FIG. 8, the angle between $L_1$ & $L_2$ is 113°; and accordingly, path 4 is considered a curved path.

Again, the arrange module 206 is configured to arrange the paths in an order in which the paths are connected in the vector graphic to form the outline of the arbitrary shape of the cross section 402. This may include the arrange module configured to identify one of the paths as a first path in the order, such as based on x, y coordinates. In the example shown in FIG. 5, path 16 may be identified as the first path in the order, and reordered as path 1. An iterative process may then be performed to arrange others of the paths after the first path in the order, connected to one another in the vector graphic of the cross section 108.

Figure 9:
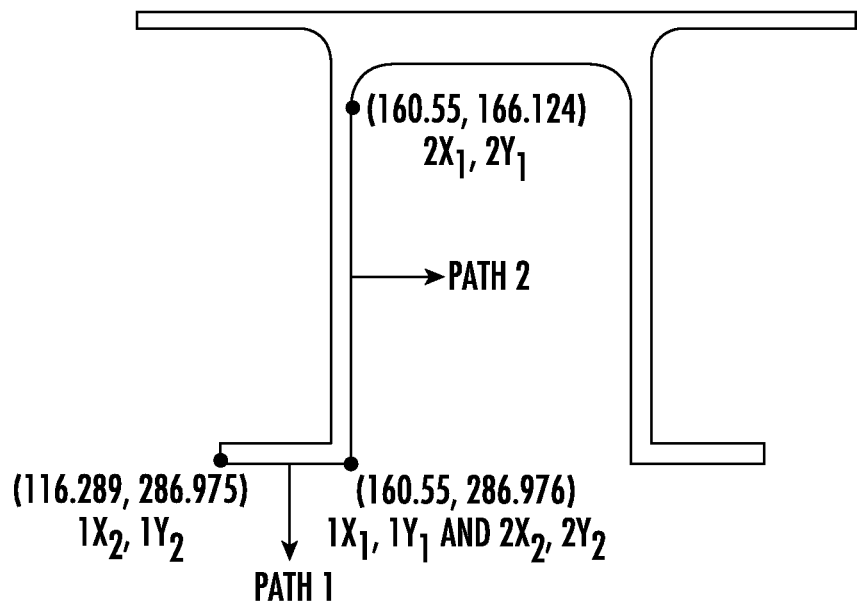
Figure 10:
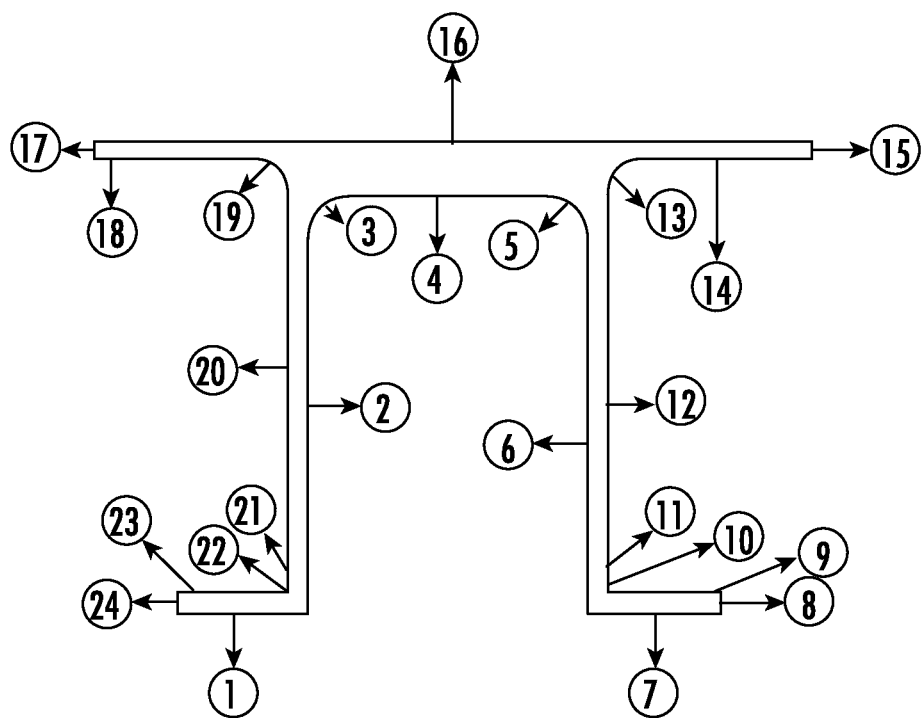

As shown in FIG. 9, a first iteration may include the arrange module 206 configured to locate for a current path in the order that in the first iteration is path 1, a connected path (reordered path 2) in the vector graphic. This may include an iterative comparison of the respective endpoints of the current path, shown as $1x_1$, $1y_1$ and $1x_2$, $1y_2$, with those of others of the paths to identify one of the respective endpoints of the connected path that matches one of the respective endpoints of the current path. In the illustrated example, this is path 15 in FIG. 5, which has endpoints $2x_1$, $2y_1$ and $2x_2$, $2y_2$. The comparison indicates that $1x_1$, $1y_1$ matches $2x_2$, $2y_2$. The connected path may then be arranged after the current path in the order, in this case, path 15 may be arranged as path 2 after path 1. In each of at least some iterations of the iterative process after the first iteration, then, the current path is the connected path located in an immediately preceding iteration. FIG. 10 illustrates the twenty-four paths after arrangement.

Figure 11:
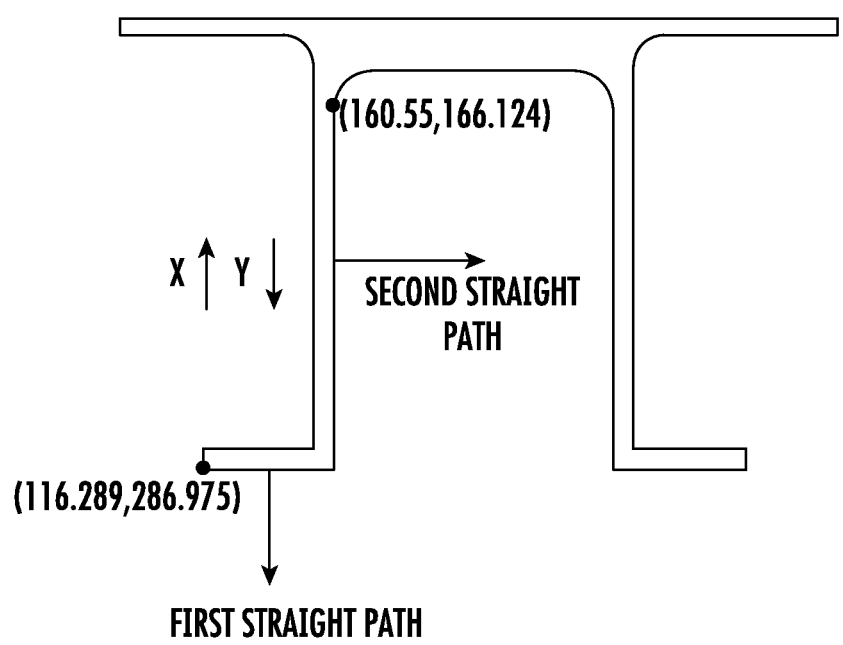

The array generator 208 may generate an array of elements for the paths such as a circular array of the elements, and define and thereby produce a first definition of the cross section 402 from the array of elements. In particular, the array generator may collect the straight paths in the order in which the straight paths are arranged. The array generator may take a pair of adjacent straight paths, including a first straight path and a second straight path, and compare their x, y coordinates (numerical coordinates), as shown in FIG. 11.

Figure 12:
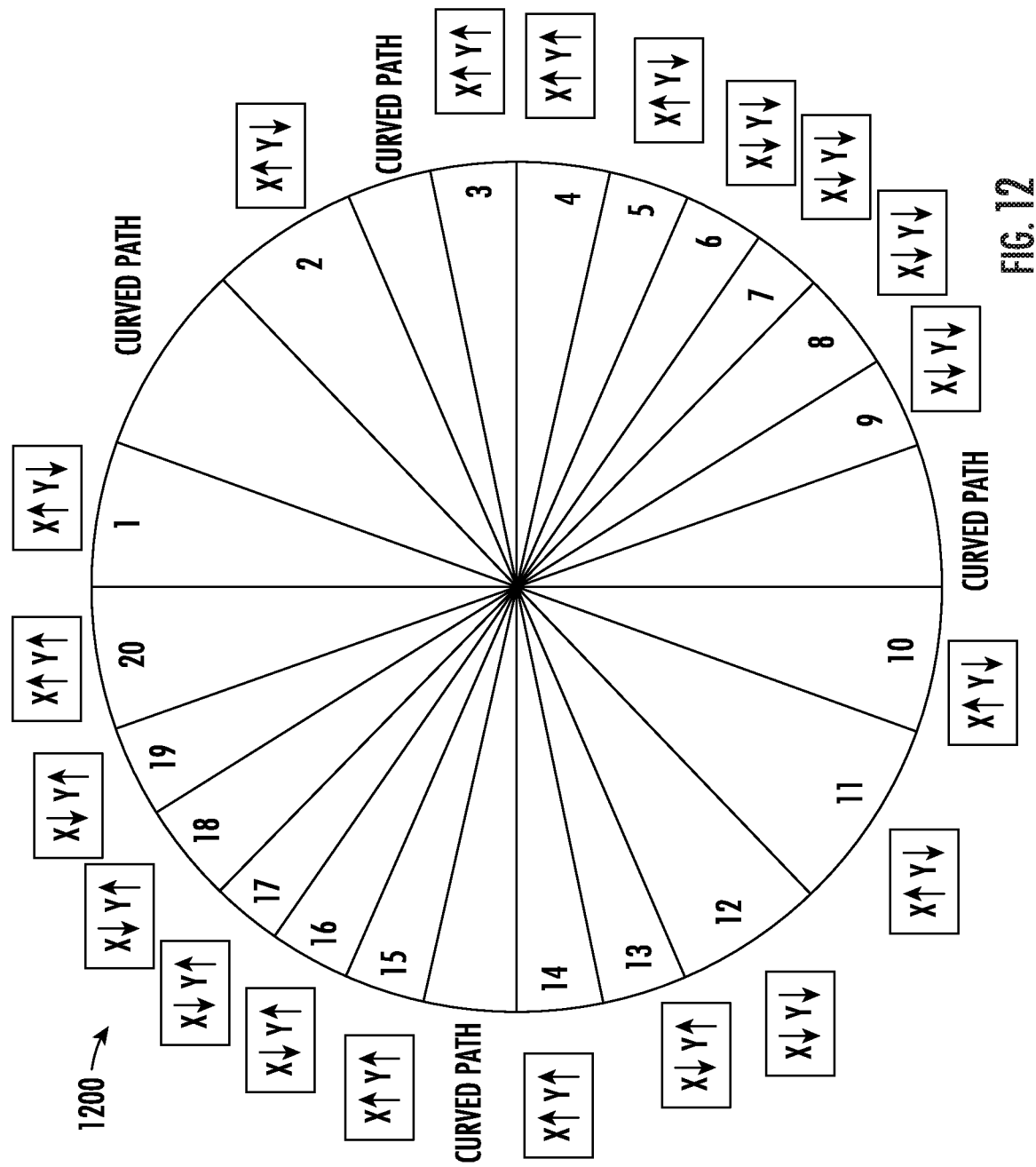

From the comparison of x, y coordinates, the array generator 208 may determine whether the x, y coordinates of the second endpoint of the second straight path (160.55, 166.124) are decreasing or increasing with respect to the x, y coordinates of the first endpoint of the first straight path (116.289, 286.975). The array of elements, then, may include an element for this pair of adjacent straight paths that indicates whether these x, y coordinates are decreasing or increasing. The array generator may repeat the process for each successive pair of adjacent straight paths, which may then result in the circular array of elements 1200 as shown in FIG. 12. As also shown, in some examples, the array of elements further includes elements for any curved paths in the order in which the paths are arranged, and that indicate those of the paths that are curved paths.

Figure 13:
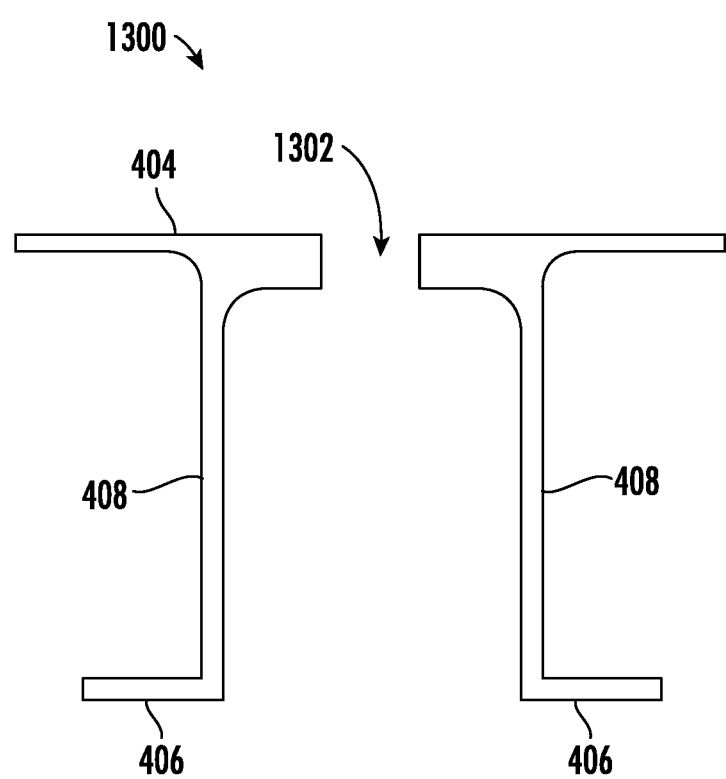
FIGS. 13, 14, 15, 16, 17, 18, 19, 20, 21, 22, 23, 24, 25, 26, 27, 28, 29, 30, 31 and 32 illustrate identifying and closing a hole in the cross section of the seat track in FIG. 4B, according to some example implementations.

Again, in some examples, the cross section defines a hole through the structure that is parallel with a cutting plane that contains the cross section. FIG. 13 illustrates another cross section 1300 of the seat track shown in FIG. 4A, in which the cross section defines a hole 1302 through the upper flange. In some of these examples, the define engine 104 may be configured to identify and then close the hole in the vector graphic of the cross section before the first definition 112 is produced. FIGS. 14-27 illustrate a process according to which the define engine may be configured to identify one or more holes in the vector graphic of the cross section, according to some examples.

Figure 14:
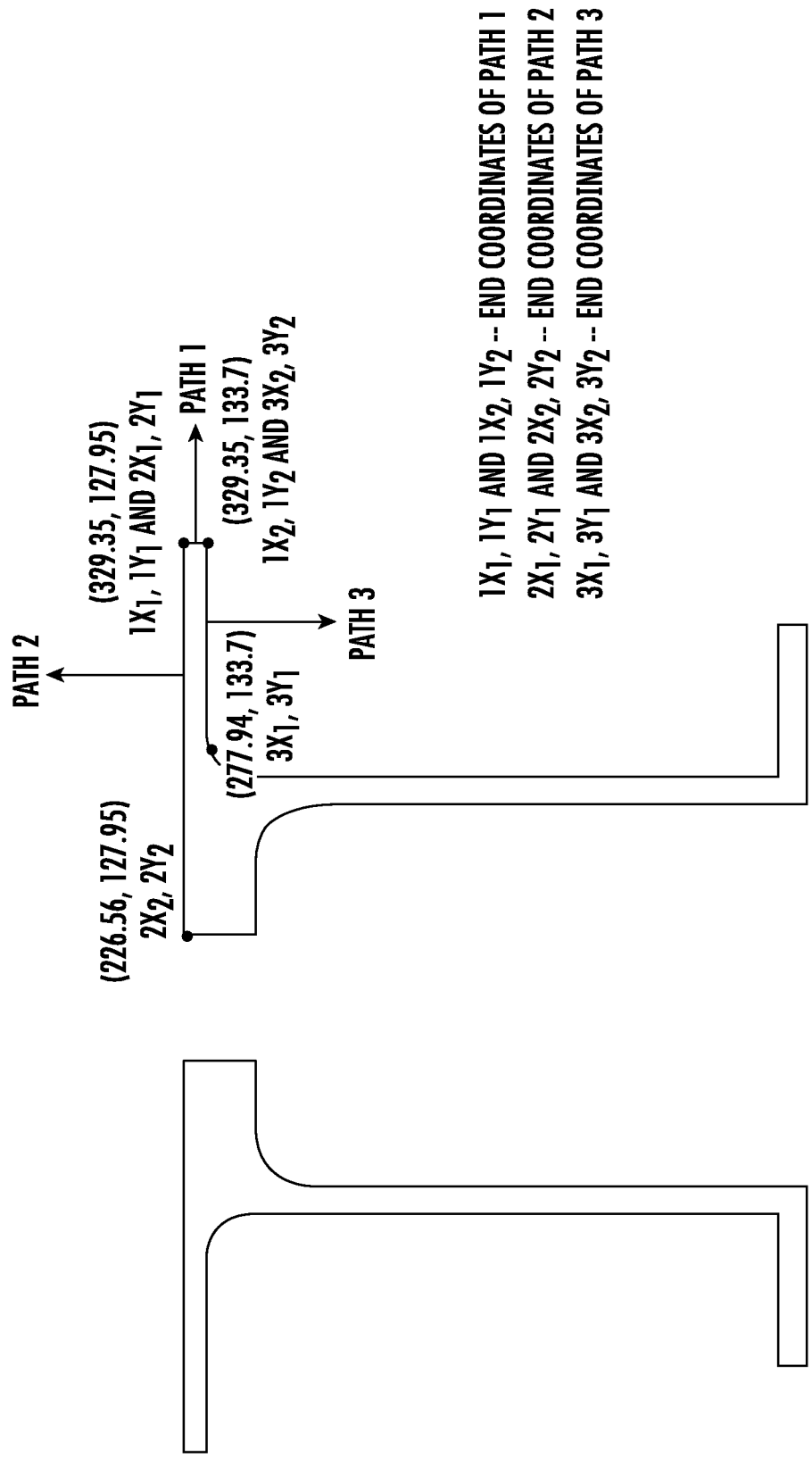
Figure 15:
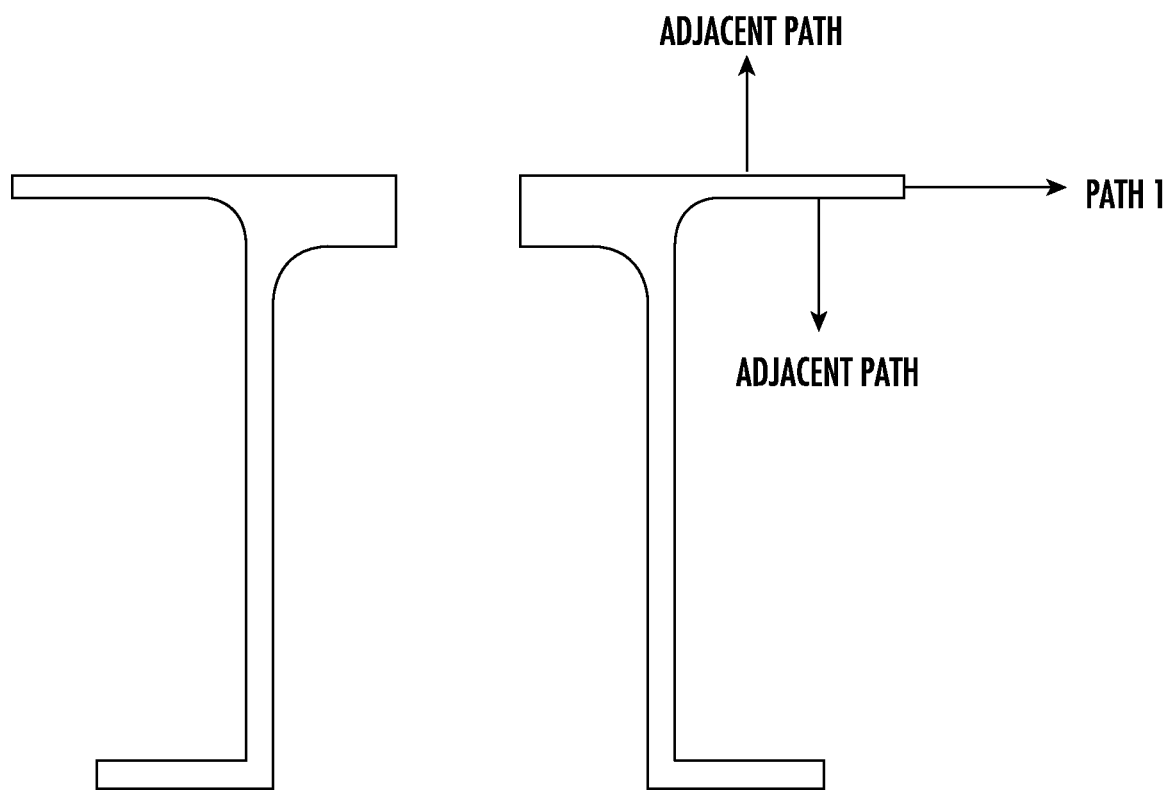

In particular, for example, the define engine 104 may identify all of the paths in the cross section, and the two adjacent paths for all of the straight paths. As shown in FIGS. 14 and 15 for the straight path represented as Path 1, for example, this may include identification of the two paths continuous to Path 1 in both the directions. More specifically, Path 2 may be identified as one of the adjacent paths as $1x_1$, $1y_1$ of Path 1 is the same as $2x_1$, $2y_1$ of Path 2. Similarly, Path 3 may be identified as the other of the adjacent paths as $1x_2$, $1y_2$ of Path 1 is the same as $3x_2$, $3y_2$ of Path 3. This may be repeated for each of the straight paths to identify their adjacent paths.

Figure 16:
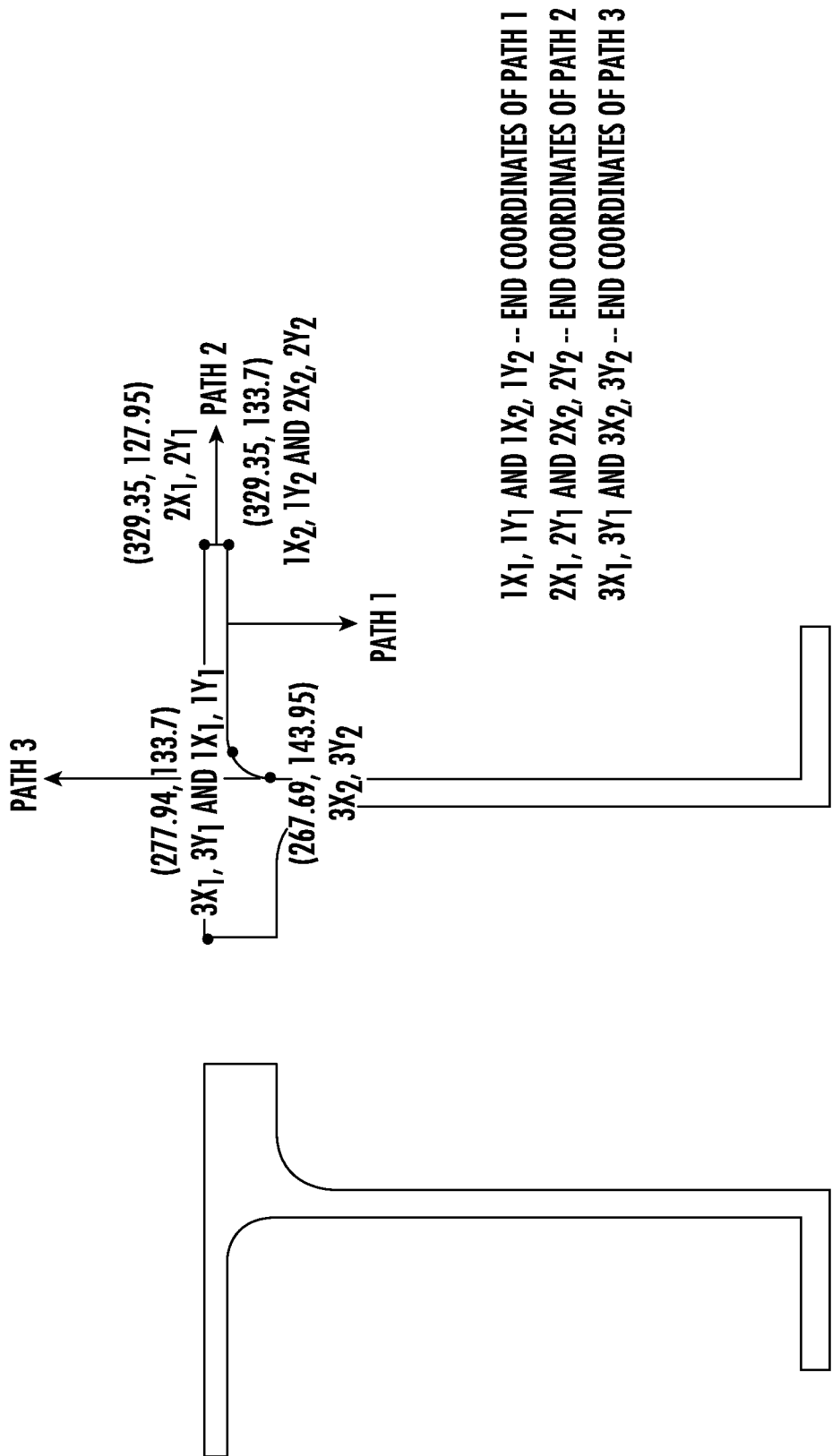

In some examples, the define engine 104 may ignore straight paths whose adjacent paths include curved paths. As shown in FIG. 16, for example, $1x_1$, $1y_1$ of Path 1 is the same as $3x_1$, $3y_1$ of Path 3, but because Path 3 is a curved path, Path 1 may be ignored from identification of the path and its adjacent paths.

Figure 17:
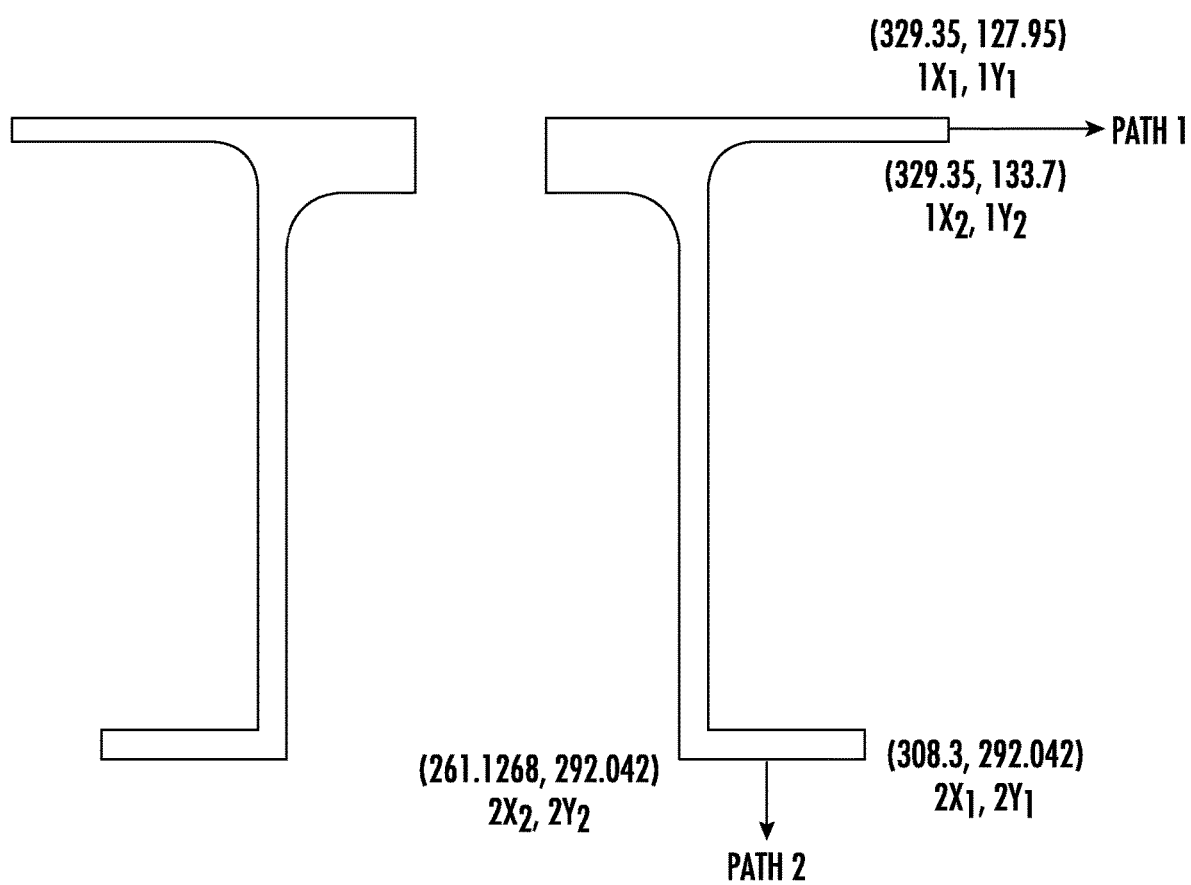

The define engine 104 may segregate the straight paths into two groups based on their slope. As shown in FIG. 17, the slope of vertical Path $1=(1y_2-1y_1)/(1x_2-1x_1)$=infinity, while the slope of horizontal Path $2=(2y_2-2y_1)/(2x_2-2x_1)=0$. In these examples, the horizontal straight paths (having slope 0) may be segregated into one group, while the vertical straight paths (having slope infinity) may be segregated into another group.

Figure 18:
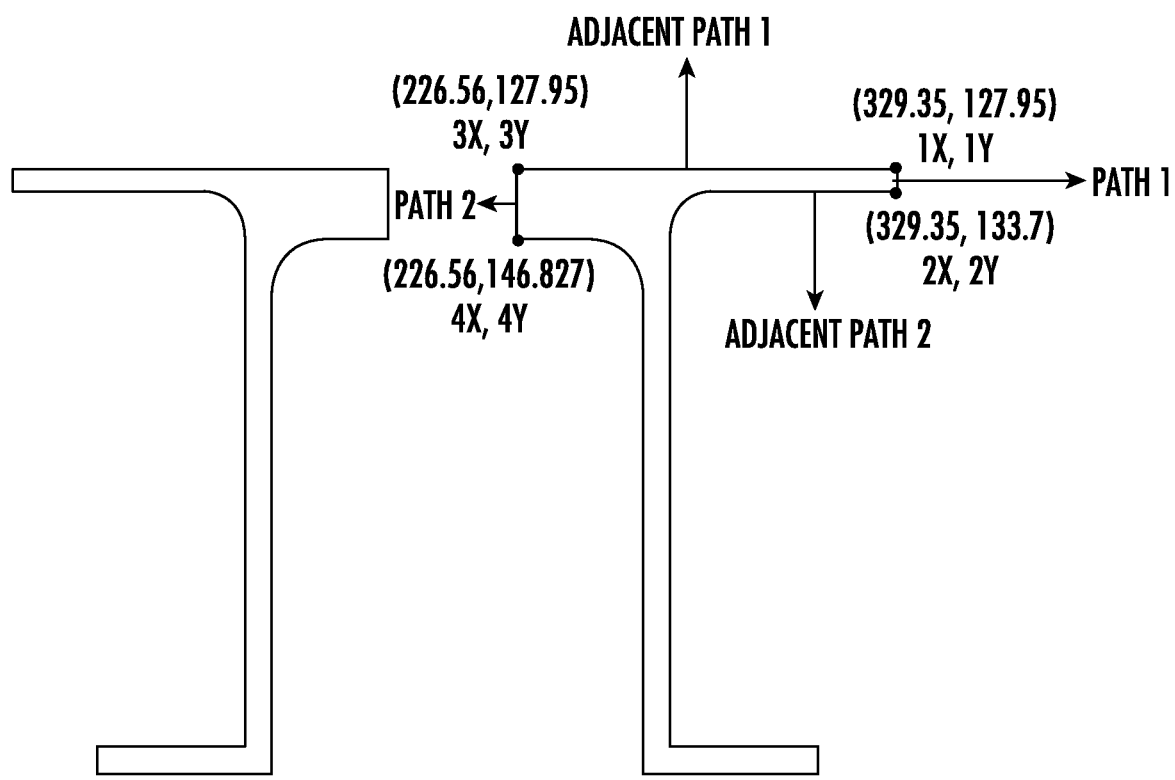

Take a first of the groups of straight paths, such as the vertical group, and a first straight path in this group and its adjacent paths, shown as Path 1 and Adjacent Paths 1 and 2 in FIG. 18. The define engine 104 may check whether the adjacent paths of the first straight path are going away or towards a next straight path. If an adjacent path of the first straight path is going toward the next straight path, the define engine may conclude no hole exists between the first and second straight paths, as is the case for both adjacent paths in FIG. 18.

Figure 19:
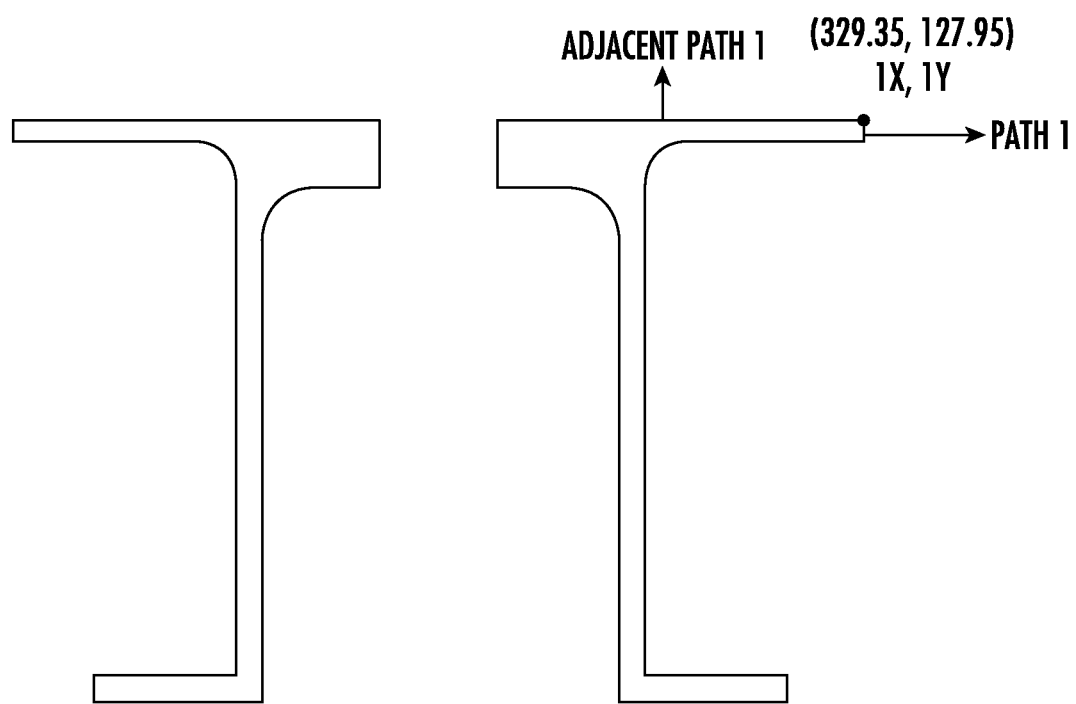
Figure 20:
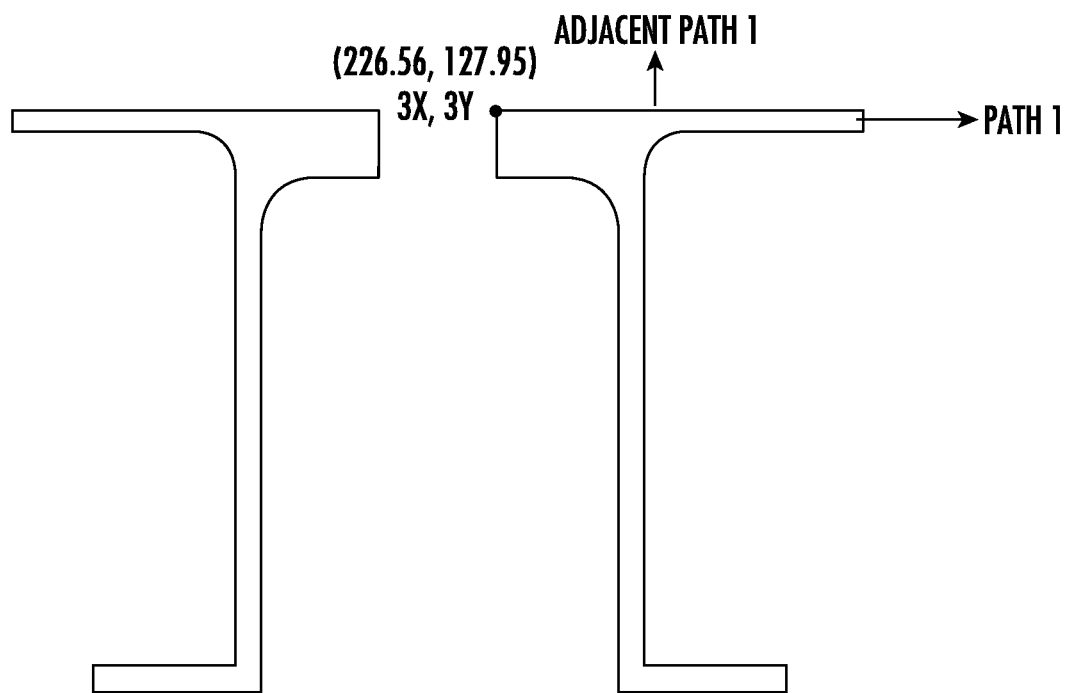

In particular, for example, consider Adjacent Path 1. As shown in FIGS. 19 and 20, the define engine 104 may find the common point between Path 1 and Adjacent Path 1, i.e., $1x$, $1y$; and find the farthest coordinates of Adjacent Path 1, i.e., $3x$, $3y$.

Figure 21:
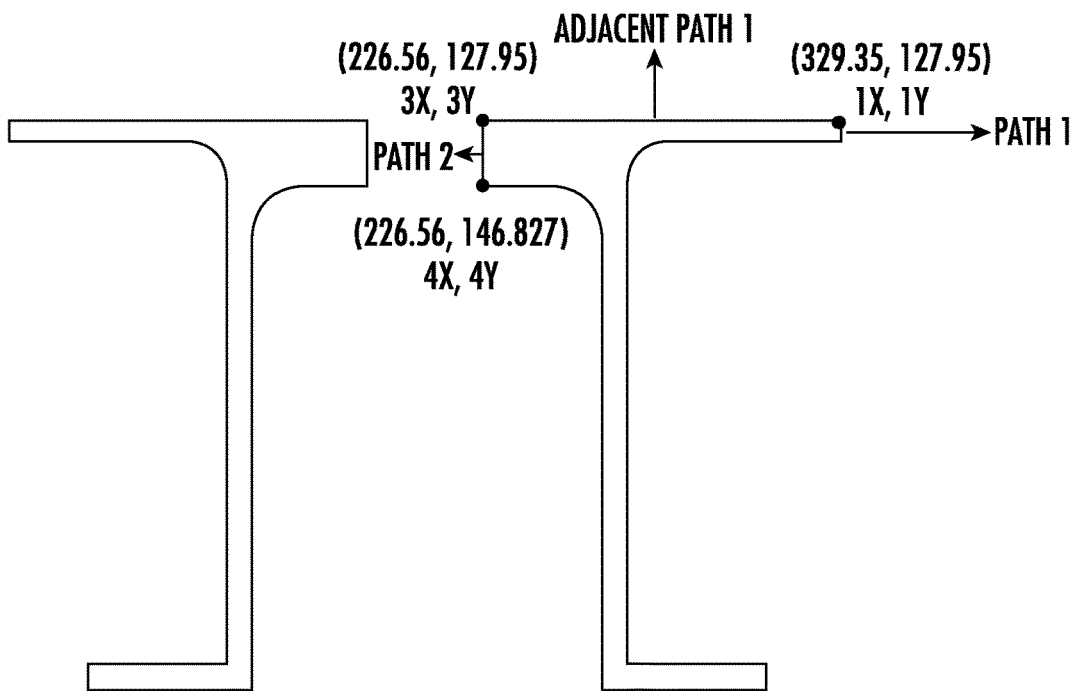
Figure 22:
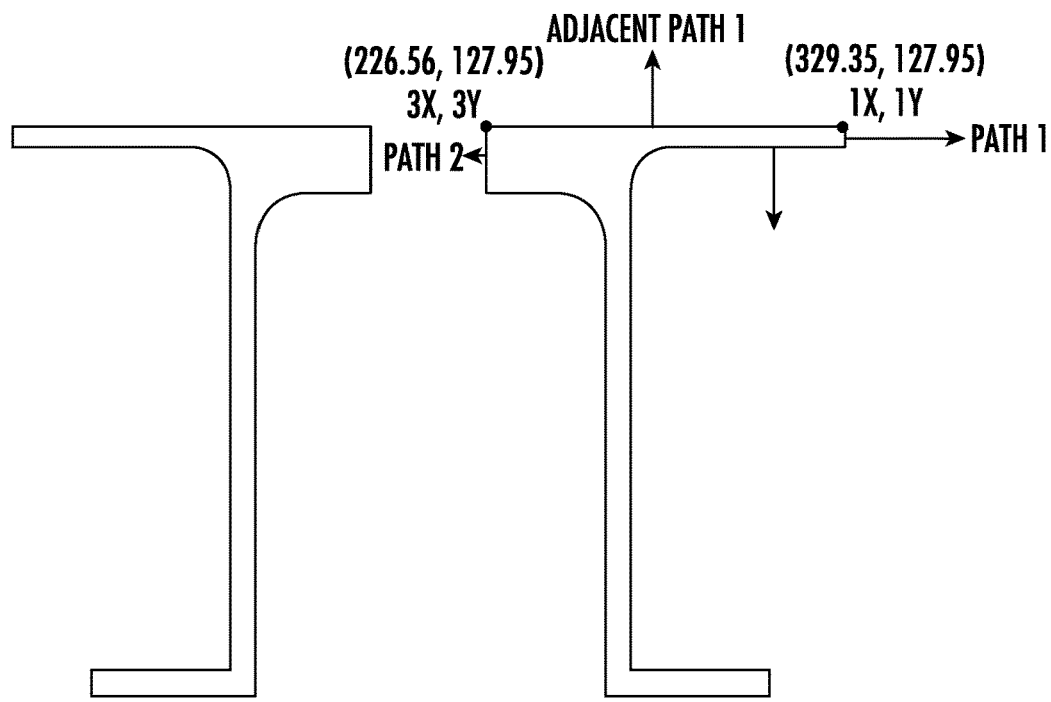

Now take the second straight path, Path 2. The define engine 104 may find the point on Path 2 that is near to the common point $1x$, $1y$. As shown in FIGS. 21, $3x$, $3y$ and $4x$, $4y$ are the endpoints of Path 2. Let the distance between $3x$, $3y$ and $1x$, $1y$ be a, and let the distance between $4x$, $4y$ and $1x$, $1y$ be b. Here, a<b, so $3x$, $3y$ is the endpoint of Path 2 that is nearer to the common point $1x$, $1y$, as shown in FIG. 22.

Let a distance 1 be the distance between the farthest point on Adjacent Path 1, i.e., $3x$, $3y$, and the nearer endpoint of Path 2. Since the nearer endpoint is also $3x$, $3y$, distance 1=0. Similarly, let a distance 2 be the distance between the common point on Adjacent Path 1, i.e., $1x$, $1y$, and the nearer endpoint of Path 2. This distance 2>0. And since distance 1<distance 2, Adjacent Path 1 is going towards Path 2. Similarly, check whether Adjacent Path 2 is going away or towards Path 2. In this example, both Adjacent Paths 1 and 2 are going towards Path 2, so there is no hole between Path 1 and Path 2.

Figure 23:
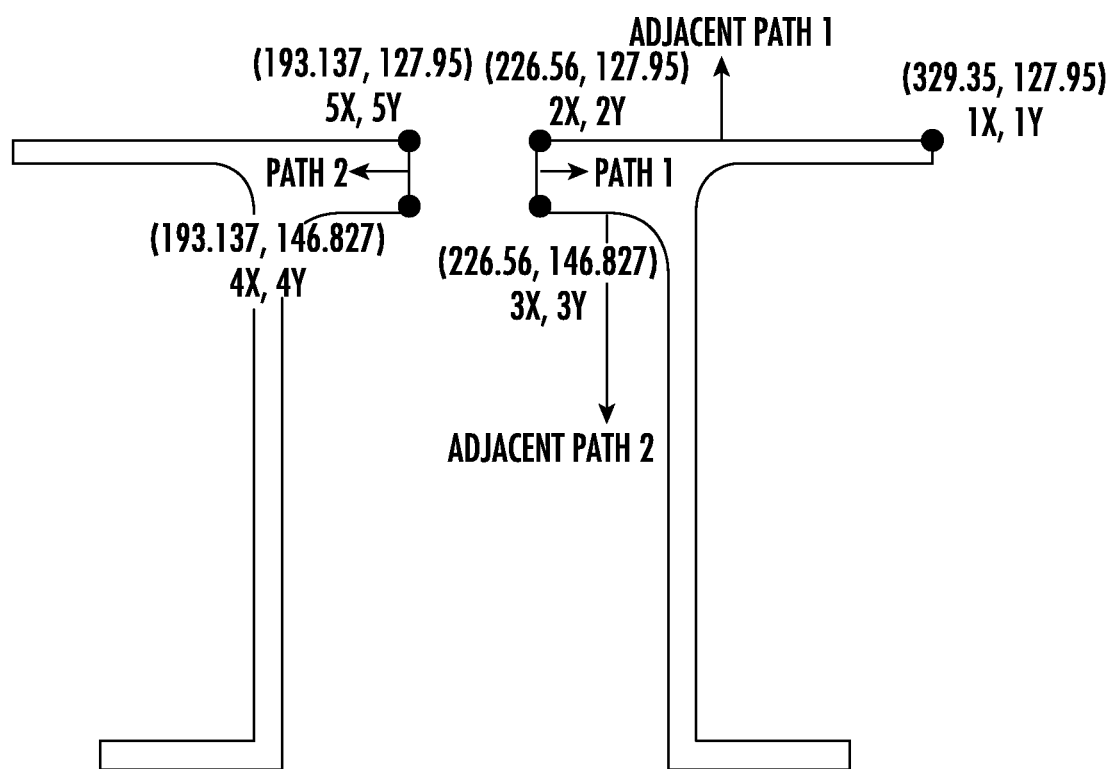

As a second example, now take the next straight path as Path 1, and its Adjacent Paths 1 and 2, as shown in FIG. 23. Again, the define engine 104 may check whether Adjacent Paths 1 and 2 of now Path 1 are going away or towards a new next straight path, shown in FIG. 23 as Path 2. If an adjacent path of the first straight path is going away from the next straight path, the define engine may conclude that a hole exists between the first and second straight paths, as is the case in FIG. 23.

Figure 24:
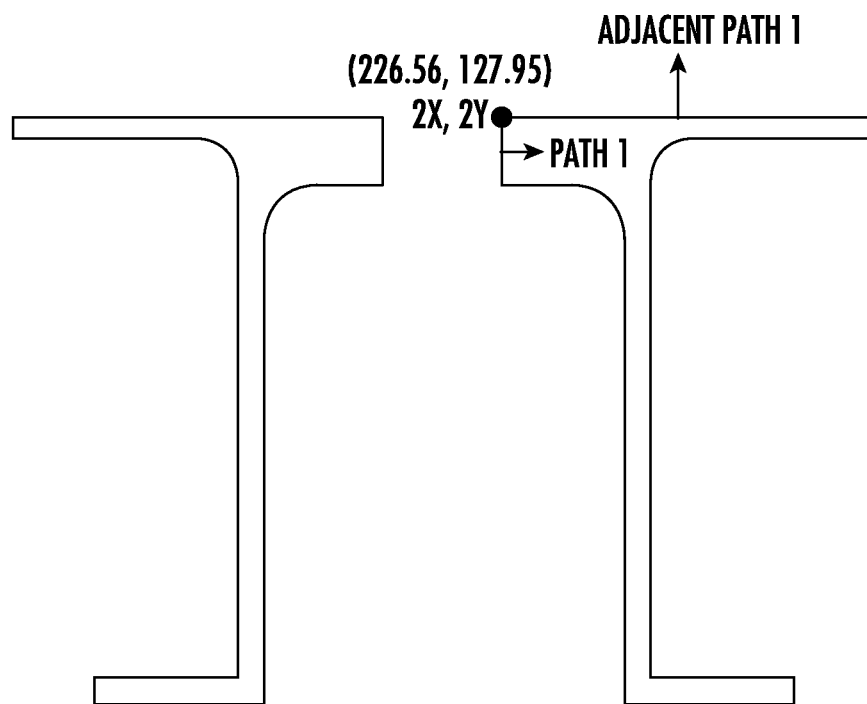
Figure 25:
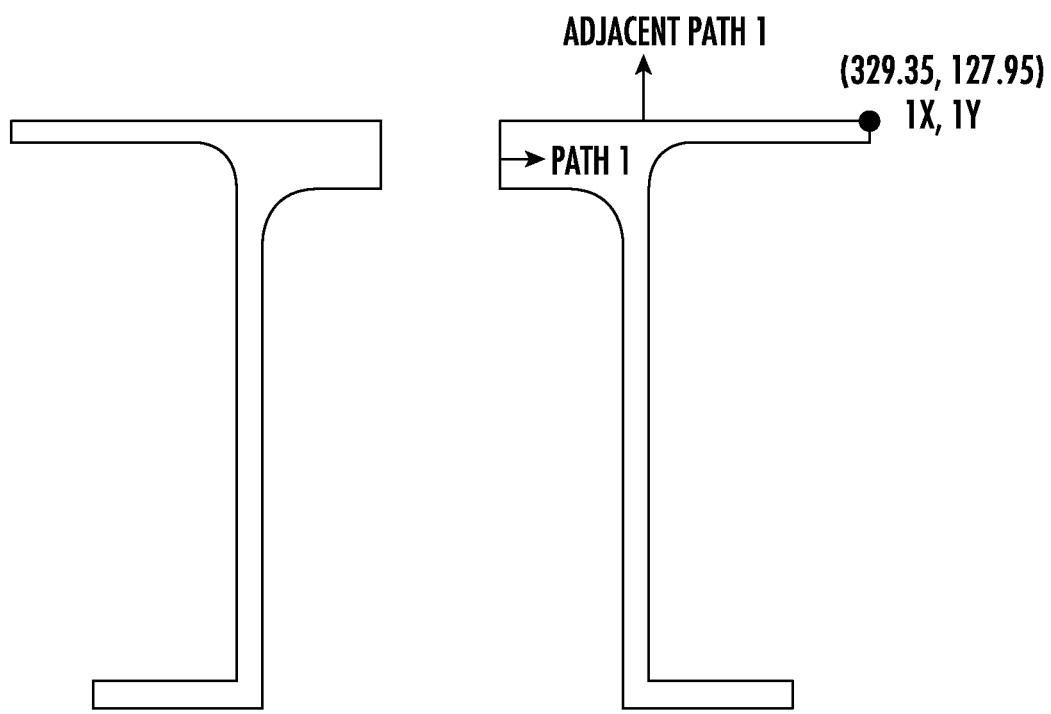

Again, for example, consider Adjacent Path 1. As shown in FIG. 24, find the common point between Path 1 and Adjacent Path 1, i.e., $2x$, $2y$. Similarly, as shown in FIG. 25, find the farthest coordinates of Adjacent Path 1, i.e., $1x$, $1y$.

Figure 26:
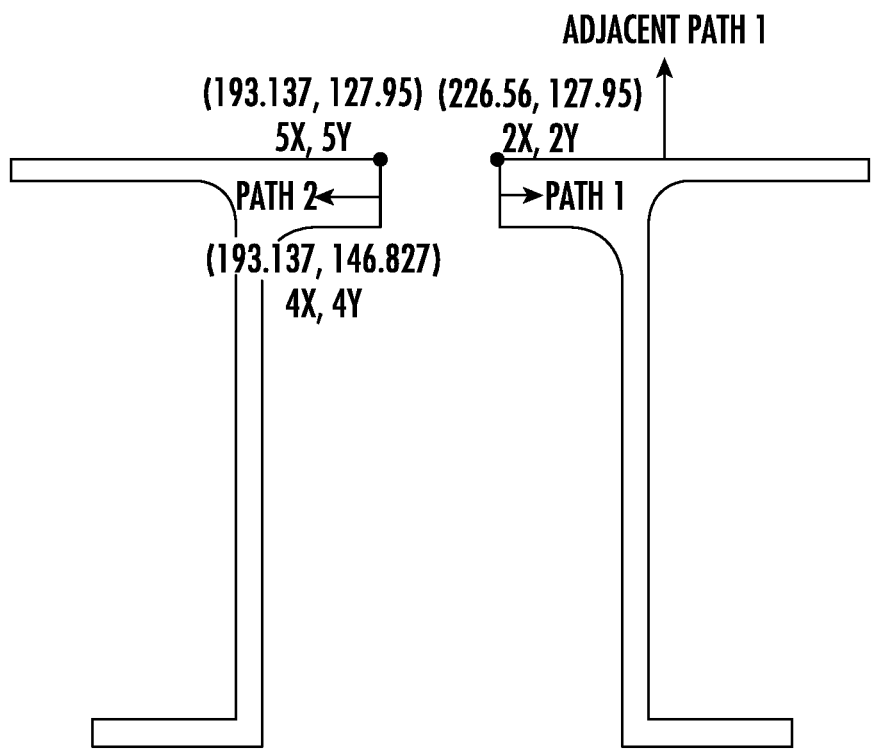
Figure 27:
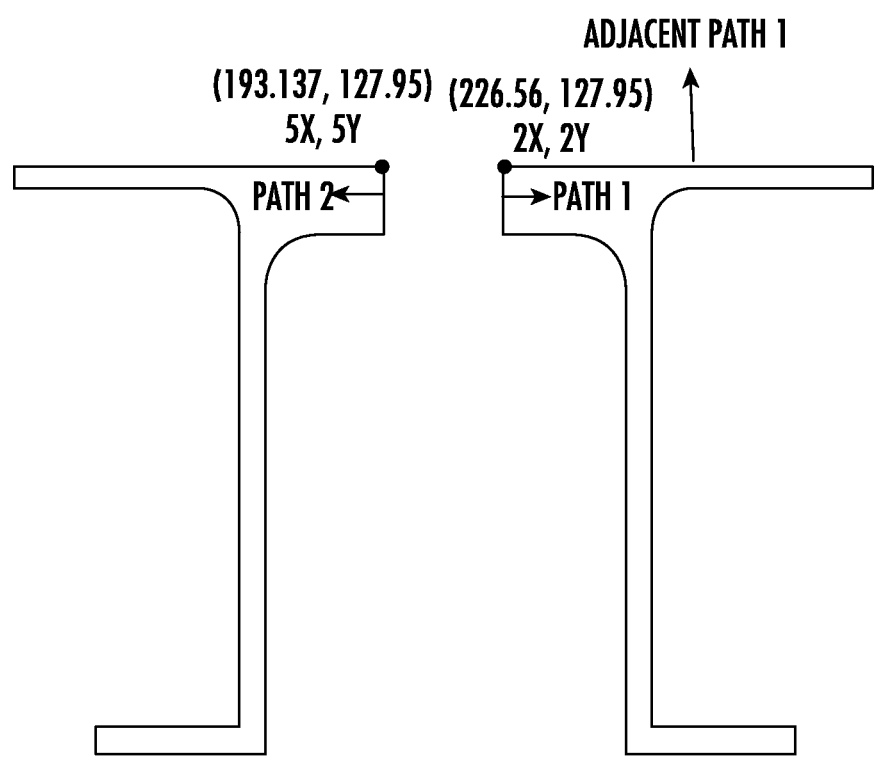

Now take the second straight path, Path 2. The define engine 104 may find the point on Path 2 that is near to the common point $2x$, $2y$. As shown in FIGS. 26, $4x$, $4y$ and $5x$, $5y$ are the endpoints of Path 2. Let the distance between $4x$, $4y$ and $2x$, $2y$ be a, and let the distance between $5x$, $5y$ and $2x$, $2y$ be b. Here, b<a, so $5x$, $5y$ is the endpoint of Path 2 that is nearer to the common point $2x$, $2y$, as shown in FIG. 27.

Let distance 1 be the distance between the farthest point on Adjacent Path 1, i.e., $1x$, $1y$, and the nearer endpoint of Path 2, i.e., $5x$, $5y$. Here, distance 1=51.58. Similarly, let distance 2 be the distance between the common point on Adjacent Path 1, i.e., $2x$, $2y$, and the nearer endpoint of Path 2. This distance 2=33.427. And since distance 1>distance 2, Adjacent Path 1 is going away from Path 2. Similarly, check whether Adjacent Path 2 is going away or towards Path 2. In this example, both Adjacent Paths 1 and 2 are going away from Path 2, so there is a hole between Path 1 and Path 2. As shown, the hole may be represented in the cross section 1300 by parallel straight Paths 1 and 2 in the vector graphic.

The define engine 104 may similarly take the other of the groups of straight paths, such as the horizontal group, to find any holes in the other group of straight paths.

Figure 28:
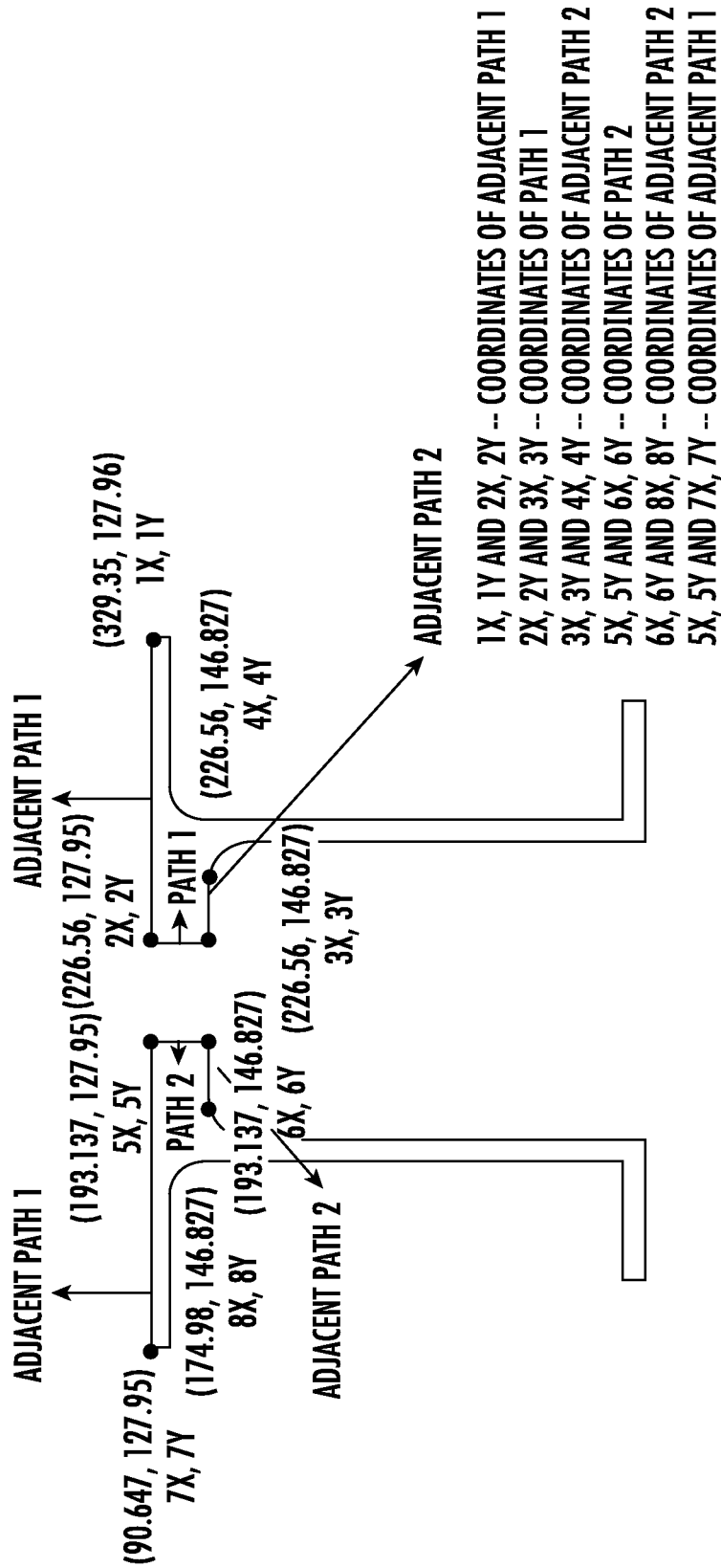

After finding the hole between Paths 1 and 2, the define engine 104 may join the paths with additional straight paths that are parallel with one another, and that are perpendicular to the parallel straight paths, and then remove Paths 1 and 2 from the vector graphic. In particular, for example, the define engine may find the coordinates of the adjacent paths of Path 1 and Path 2, as shown in FIG. 28.

Figure 29:
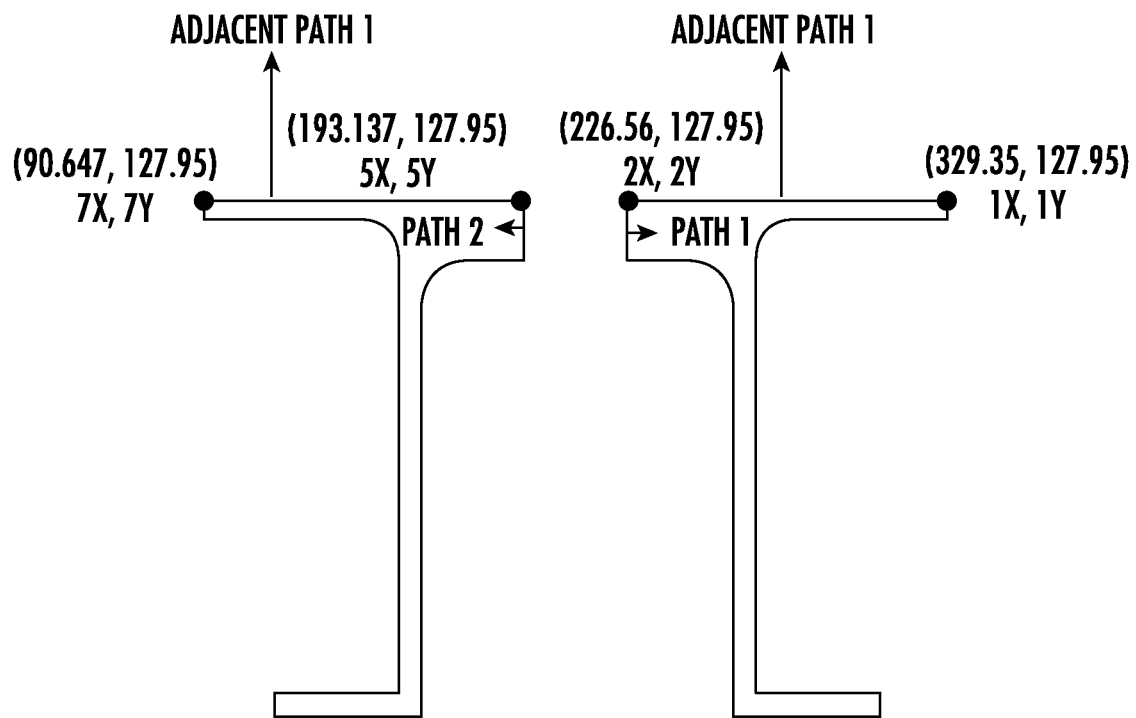
Figure 30:
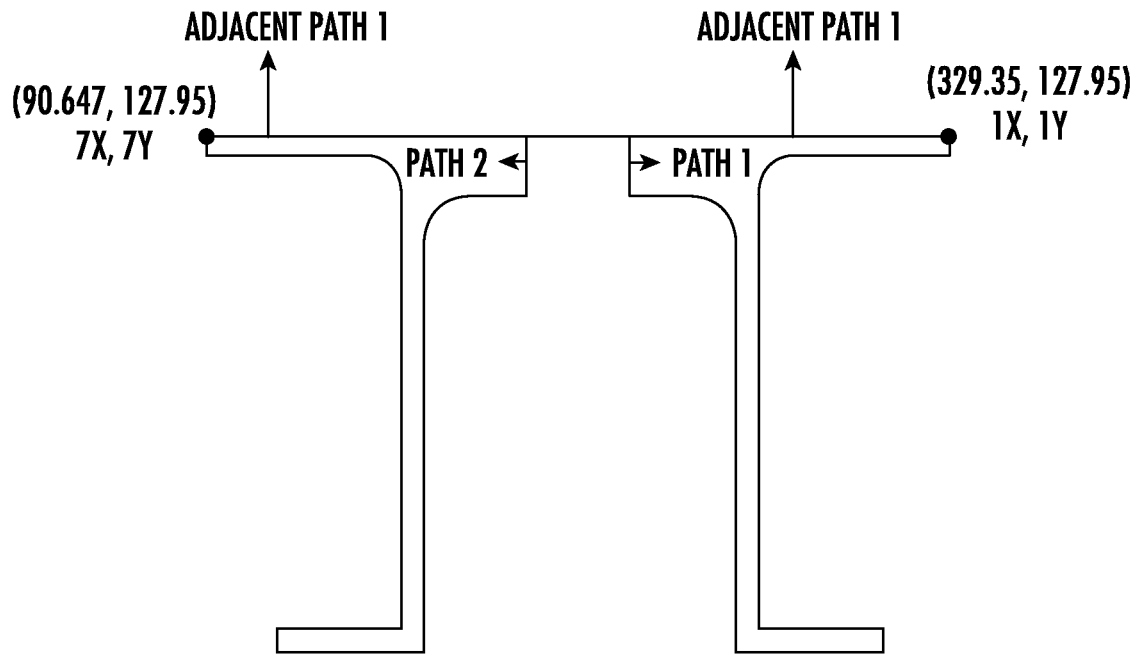

Take the Adjacent Path 1 of Path 1. The define engine 104 may find the adjacent path of Path 2 that is parallel to Adjacent Path 1 of Path 1, which is Adjacent Path 1 of Path 2, as shown in FIG. 29. The define engine may find the coordinates of the farthest endpoint of Adjacent Path 1 of Path 1 and Adjacent Path 1 of Path 2, here respectively, $1x$, $1y$ and $7x$, $7y$. The define engine may create a new straight path with the coordinates of the farthest endpoints $1x$, $1y$ and $7x$, $7y$, as shown in FIG. 30, and remove Adjacent Path 1 of Path 1 and Adjacent Path 1 of Path 2 from the collection of straight paths.

Figure 31:
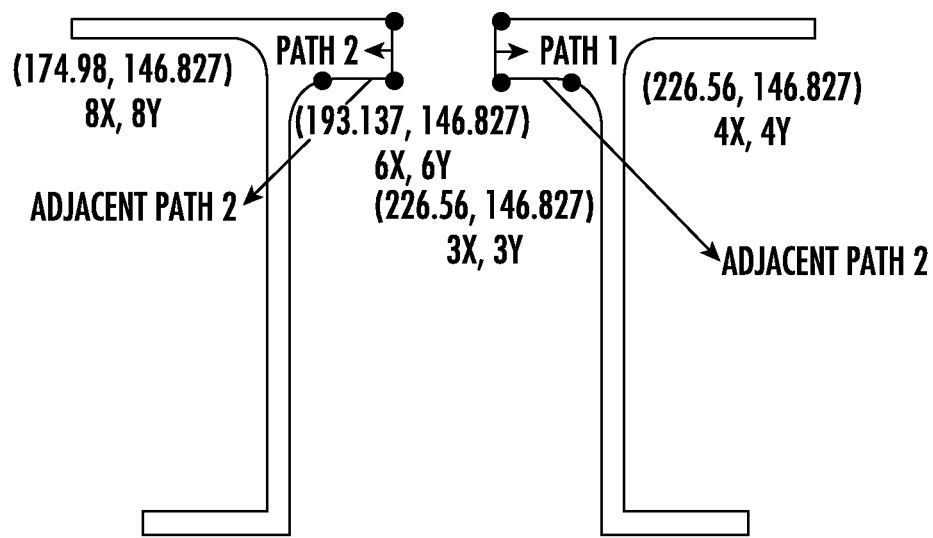
Figure 32:
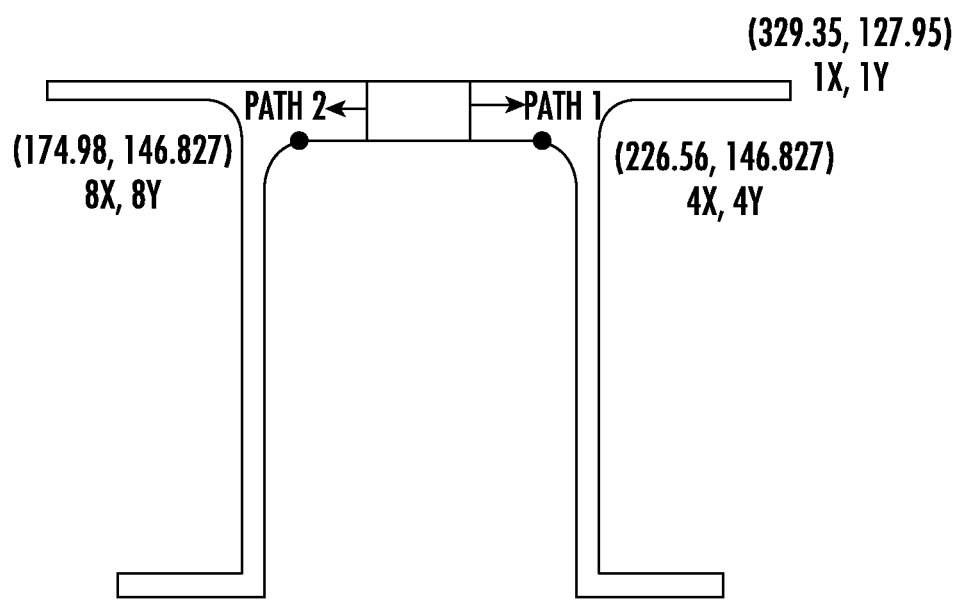

Similarly, take the Adjacent Path 2 of Path 1. The define engine 104 may find the adjacent path of Path 2 that is parallel to Adjacent Path 1 of Path 1, which is Adjacent Path 2 of Path 2, as shown in FIG. 31. The define engine may find the coordinates of the farthest endpoint of Adjacent Path 2 of Path 1 and Adjacent Path 2 of Path 2, here respectively, $4x$, $4y$ and $8x$, $8y$. The define engine may create a new straight path with the coordinates of the farthest endpoints $4x$, $4y$ and $8x$, $8y$, as shown in FIG. 32, and remove Adjacent Path 2 of Path 1 and Adjacent Path 2 of Path 2 from the collection of straight paths. The end result, then, is the cross section 402 shown in FIG. 4.

Figure 33:
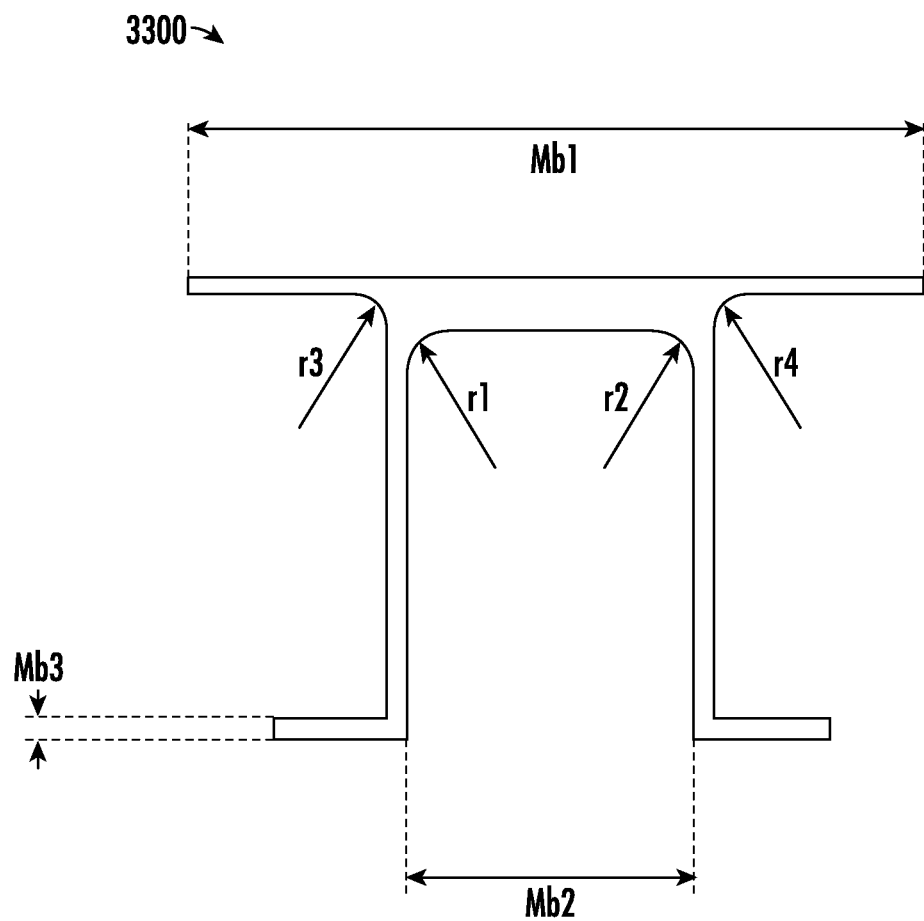
FIG. 33 illustrates a template cross section, according to some example implementations.
Figure 34:
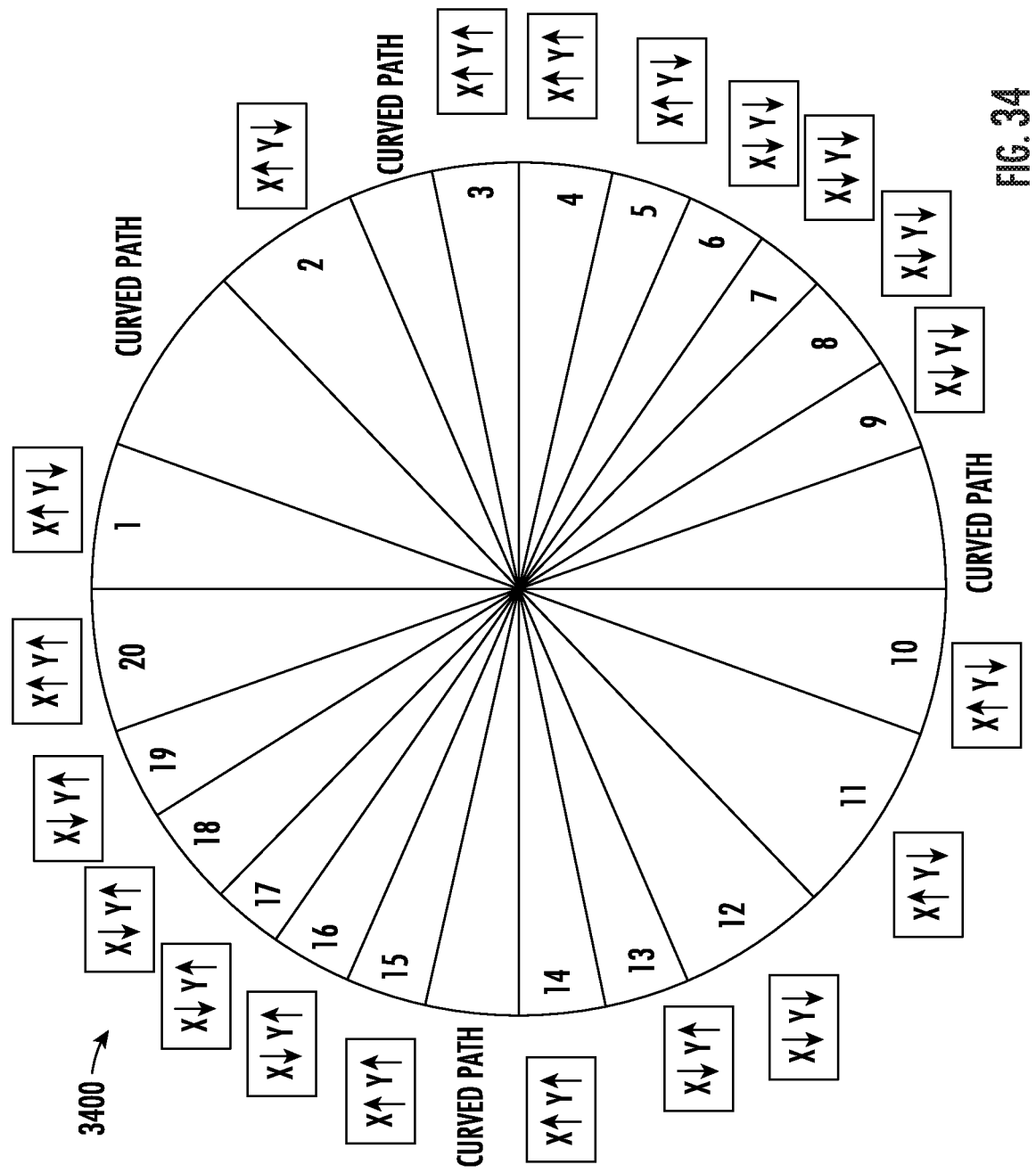
FIG. 34 illustrates a circular array of elements from which a second definition of the template cross section shown in FIG. 33 may be produced, according to some example implementations.

As also explained above, the dimensioning engine 106, and in particular its access module 302, is configured to access template cross sections 114 of various shapes, the template cross sections having respective second definitions 116. These second definitions may be similar to the first definition 112 of the cross section 108, and may even be produced by the define engine 104 for the template cross sections, such as in a manner similar to that described above. FIG. 33 illustrates an example of a template cross section 3300 that has locations Mb1, Mb2, Mb3, r1, r2, r3 and r4 from which the template cross section is dimensioned. FIG. 34 illustrates an example of a circular array of elements 3400 from which a second definition of the template cross section shown in FIG. 33 may be produced.

The matching module 304 of the dimensioning engine 106 is configured to perform a comparison of the first definition 112 of the cross section and the respective second definitions 116 of the template cross sections 114, and identify a matching one of the template cross sections based on the comparison. In the illustrated example, this may include identifying a match between the circular array of elements 1200 for the cross section 402, and the circular array of elements 3400 for the template cross section 3300. In some examples, an otherwise matching one of the template cross sections may be rotated relative to the cross section. In these examples, the matching module may be configured to perform its comparison iteratively on rotated versions of the template cross section, as explained in greater detail above.

Figure 35:
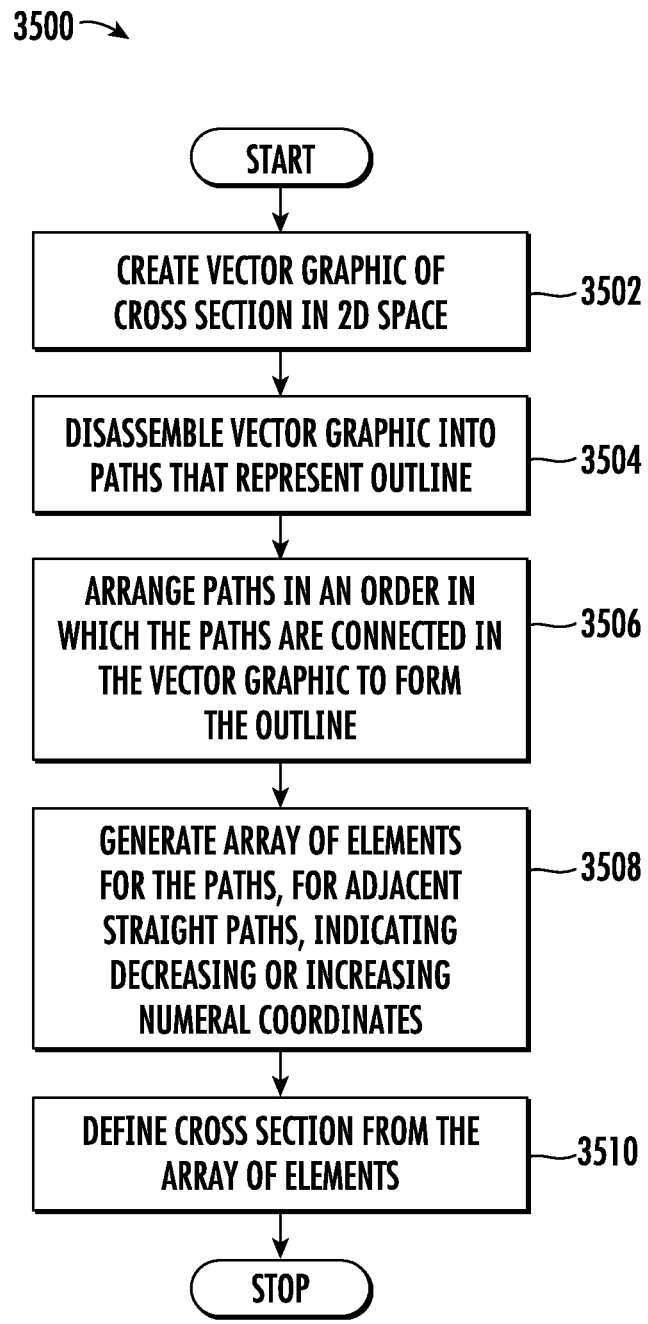
FIG. 35 is a flowchart illustrating various steps in a method of defining a cross section of a structure, the cross section having an arbitrary shape, according to example implementations.

FIG. 35 is a flowchart illustrating various steps in a method 3500 of defining a cross section of a structure, the cross section having an arbitrary shape, according to example implementations of the present disclosure. As shown at block 3502, the method includes creating a vector graphic of the cross section in a two-dimensional (2D) space in which points are specified by numerical coordinates. The method includes disassembling the vector graphic of the cross section into paths that represent an outline of the arbitrary shape of the cross section, each path a straight path or a curved path having respective endpoints including a first endpoint and a second endpoint, as shown at block 3504.

As shown at block 3506, the method 3500 includes arranging the paths in an order in which the paths are connected in the vector graphic to form the outline of the arbitrary shape of the cross section. The method includes generating an array of elements for the paths, as shown at block 3508. This includes elements for successive pairs of adjacent straight paths in the order in which the paths are arranged, each element indicating for a respective one of the successive pairs, including a first straight path and an adjacent, second straight path, whether the numerical coordinates of the second endpoint of the second straight path are decreasing or increasing with respect to the numerical coordinates of the first endpoint of the first straight path. And the method includes defining and thereby producing a definition of the cross section from the array of elements, as shown at block 3510.

Figure 36:
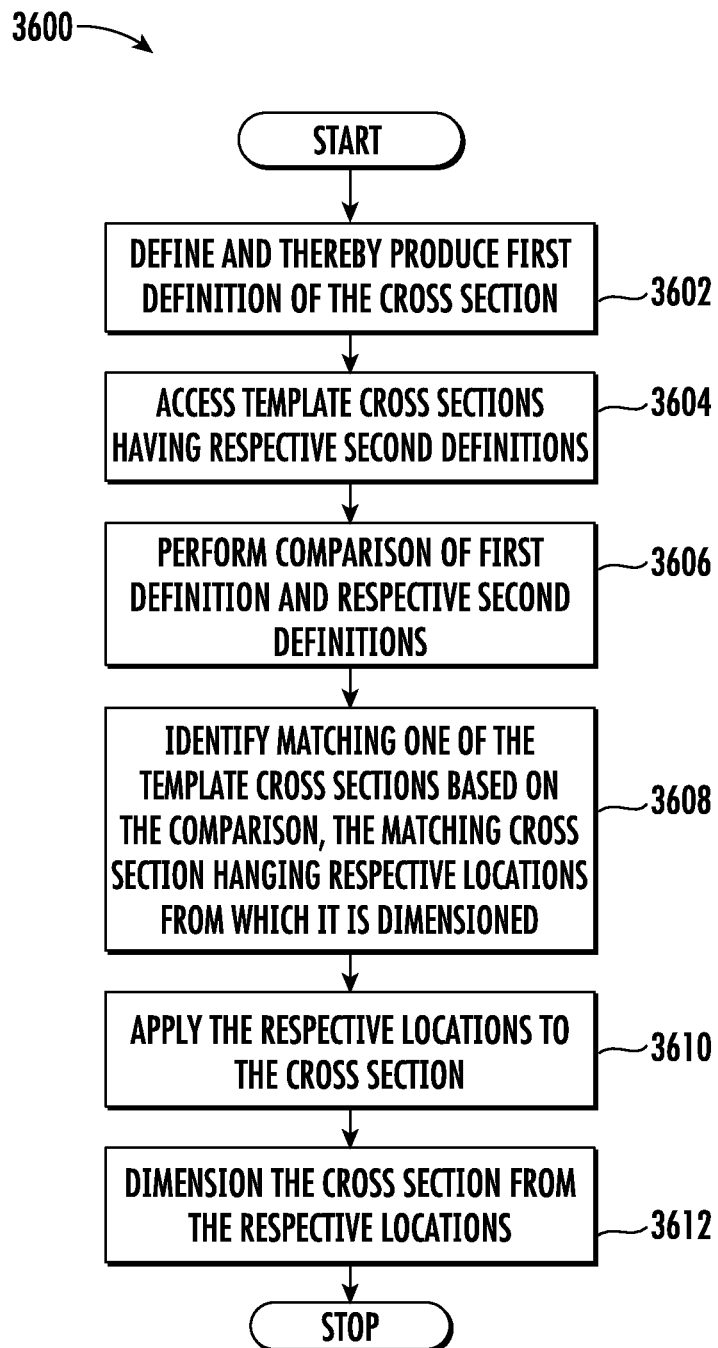
FIG. 36 is a flowchart illustrating various steps in a method of dimensioning a cross section of a structure, the cross section having an arbitrary shape, according to example implementations.

FIG. 36 is a flowchart illustrating various steps in a method 3600 of dimensioning a cross section of a structure, the cross section having an arbitrary shape, according to example implementations of the present disclosure. As shown at blocks 3602 and 3604, the method includes defining and thereby producing a first definition of the cross section, and accessing template cross sections of various shapes, the template cross sections having respective second definitions of the template cross sections. The method includes performing a comparison of the first definition of the cross section and the respective second definitions of the template cross sections, as shown at block 3606.

As shown at block 3608, the method 3600 includes identifying a matching one of the template cross sections based on the comparison, the matching one of the template cross sections further having respective locations from which the matching one of the template cross sections is dimensioned. The method further includes applying the respective locations to the cross section, and dimensioning the cross section from the respective locations, as shown at blocks 3610 and 3612. According to these example implementations, the cross section and template cross sections are vector graphics, and each of the first definition and the second definitions includes an array of elements for paths of a respective one of the vector graphics. This includes elements for successive pairs of adjacent straight paths in an order in which the paths are connected, each element indicating for a respective one of the successive pairs, whether numerical coordinates of a second endpoint of a second straight path are decreasing or increasing with respect to the numerical coordinates of a first endpoint of a first straight path.

In some examples, dimensioning the cross section includes measuring and thereby producing measurements of dimensions of the cross section measured at the respective locations. In some of these examples, the method 3600 further includes manufacturing the structure according to the measurements of the dimensions of the cross section.

According to example implementations of the present disclosure, the system 100 and its subsystems including the graphics software 102, define engine 104 and dimensioning engine 106 may be implemented by various means. Means for implementing the system and its subsystems may include hardware, alone or under direction of one or more computer programs from a computer-readable storage medium. In some examples, one or more apparatuses may be configured to function as or otherwise implement the system and its subsystems shown and described herein. In examples involving more than one apparatus, the respective apparatuses may be connected to or otherwise in communication with one another in a number of different manners, such as directly or indirectly via a wired or wireless network or the like.

Figure 37:
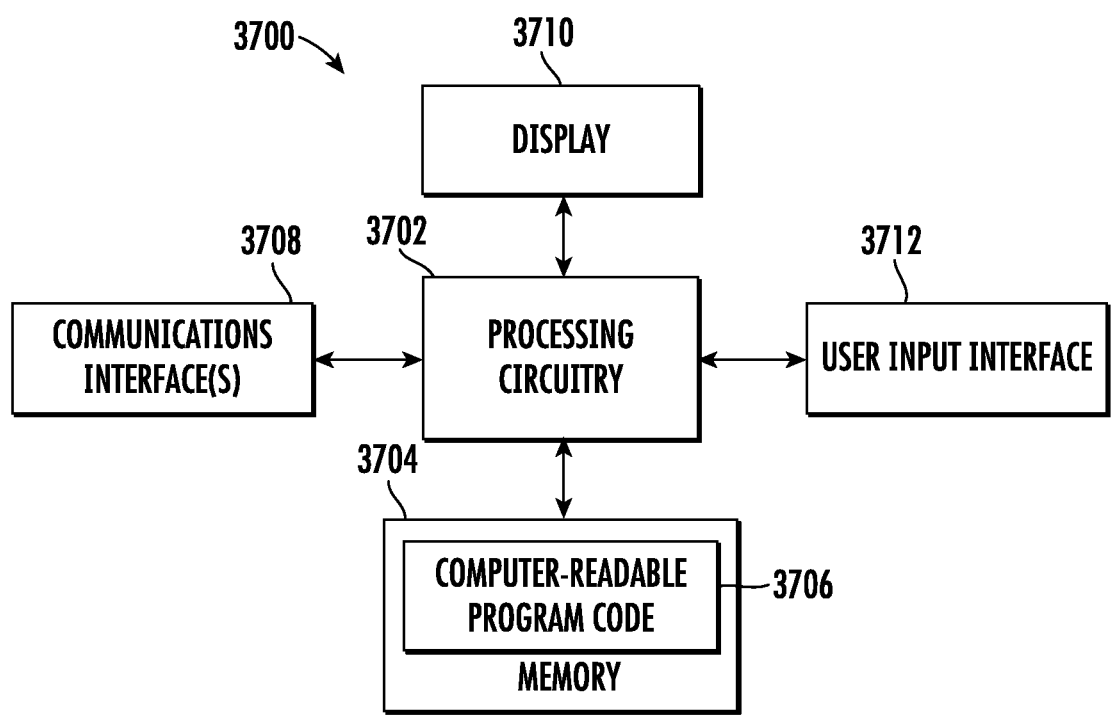
FIG. 37 illustrates an apparatus according to some example implementations.

FIG. 37 illustrates an apparatus 3700 according to some example implementations of the present disclosure. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processing circuitry 3702 (e.g., processor unit) connected to a memory 3704 (e.g., storage device).

The processing circuitry 3702 may be composed of one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in the memory 3704 (of the same or another apparatus).

The processing circuitry 3702 may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory 3704 is generally any piece of computer hardware that is capable of storing information such as, for example, data, computer programs (e.g., computer-readable program code 3706) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 3704, the processing circuitry 3702 may also be connected to one or more interfaces for displaying, transmitting and/or receiving information. The interfaces may include a communications interface 3708 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 3710 and/or one or more user input interfaces 3712 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, an apparatus 3700 may include a processing circuitry 3702 and a computer-readable storage medium or memory 3704 coupled to the processing circuitry, where the processing circuitry is configured to execute computer-readable program code 3706 stored in the memory. It will also be understood that one or more functions, and combinations of functions, may be implemented by special purpose hardware-based computer systems and/or processing circuitry which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for defining a cross section of a structure, the cross section having an arbitrary shape, the apparatus comprising:
   a memory configured to store computer-readable program code; and
   processing circuitry configured to access the memory, and execute the computer-readable program code to cause the apparatus to at least:
   create a vector graphic of the cross section in a two-dimensional (2D) space in which points are specified by numerical coordinates;
   disassemble the vector graphic of the cross section into paths that represent an outline of the arbitrary shape of the cross section, each path a straight path or a curved path having respective endpoints including a first endpoint and a second endpoint;
   arrange the paths in an order in which the paths are connected in the vector graphic to form the outline of the arbitrary shape of the cross section;
   generate a circular array of elements for the paths, including elements for successive pairs of adjacent straight paths in the order in which the paths are arranged, each element indicating for a respective one of the successive pairs, including a first straight path and an adjacent, second straight path, whether the numerical coordinates of the second endpoint of the second straight path are decreasing or increasing with respect to the numerical coordinates of the first endpoint of the first straight path; and
   define and thereby produce a definition of the cross section from the circular array of elements.

2. The apparatus of claim 1, wherein the apparatus caused to disassemble the vector graphic includes the apparatus caused to remove from the paths, at least one duplicate path that shares the respective endpoints with another of the paths.

3. The apparatus of claim 1, wherein the apparatus caused to create the vector graphic includes the apparatus caused to create a computer file having a vector image format in which the vector graphic encoded for storage in the computer file, the vector graphic defined by specific points in the 2D space and commands to draw the paths between the specific points, and
   wherein the apparatus caused to disassemble the vector graphic includes the apparatus caused to differentiate the paths as straight paths and any curved paths, based on the specific points and commands by which the vector graphic is defined.

4. The apparatus of claim 3, wherein the apparatus caused to differentiate the paths includes the apparatus caused to identify those of the paths as straight paths formed of a single line drawn from only one of a command to draw a line from a current specific point to a given specific point, or formed of multiple lines drawn from multiple successive ones of the command in which an angle between a first number of multiple lines and a last number of the multiple lines is less than or equal to a threshold.

5. The apparatus of claim 3, wherein the apparatus caused to differentiate the paths includes the apparatus caused to identify those of the paths as curved paths formed of multiple lines drawn from multiple successive ones of a command to draw a line from a current specific point to a given specific point, in which an angle between a first number of multiple lines and a last number of the multiple lines is greater than a threshold.

6. The apparatus of claim 1, wherein the apparatus caused to arrange the paths includes the apparatus caused to at least:
   identify one of the paths as a first path in the order; and
   perform an iterative process to arrange others of the paths after the first path in the order, connected to one another in the vector graphic, a first iteration including the apparatus caused to:
      locate for a current path in the order that in the first iteration is the first path, a connected path in the vector graphic, including iteratively compare the respective endpoints of the current path with those of others of the paths to identify one of the respective endpoints of the connected path that matches one of the respective endpoints of the current path; and
      arrange the connected path after the current path in the order,
   wherein in each of at least some iterations of the iterative process after the first iteration, the current path is the connected path located in an immediately preceding iteration.

7. The apparatus of claim 1, wherein the apparatus caused to generate the circular array of elements includes the apparatus caused to generate the circular array of elements further including elements for any curved paths in the order in which the paths are arranged, and that indicate those of the paths that are curved paths.

8. The apparatus of claim 1, wherein the apparatus is caused to disassemble the vector graphic into the paths that include one or more straight paths and one or more curved paths.

9. A method of defining a cross section of a structure, the cross section having an arbitrary shape, the method comprising:
   executing computer-readable program code by processing circuitry to cause an apparatus to perform operations to define the cross section, including:
   creating a vector graphic of the cross section in a two-dimensional (2D) space in which points are specified by numerical coordinates;
   disassembling the vector graphic of the cross section into paths that represent an outline of the arbitrary shape of the cross section, each path a straight path or a curved path having respective endpoints including a first endpoint and a second endpoint;
   arranging the paths in an order in which the paths are connected in the vector graphic to form the outline of the arbitrary shape of the cross section;
   generating a circular array of elements for the paths, including elements for successive pairs of adjacent straight paths in the order in which the paths are arranged, each element indicating for a respective one of the successive pairs, including a first straight path and an adjacent, second straight path, whether the numerical coordinates of the second endpoint of the second straight path are decreasing or increasing with respect to the numerical coordinates of the first endpoint of the first straight path; and
   defining and thereby producing a definition of the cross section from the circular array of elements.

10. The method of claim 9, wherein disassembling the vector graphic includes removing from the paths, at least one duplicate path that shares the respective endpoints with another of the paths.

11. The method of claim 9, wherein creating the vector graphic includes creating a computer file having a vector image format in which the vector graphic encoded for storage in the computer file, the vector graphic defined by specific points in the 2D space and commands to draw the paths between the specific points, and wherein disassembling the vector graphic includes differentiating the paths as straight paths and any curved paths, based on the specific points and commands by which the vector graphic is defined.

12. The method of claim 11, wherein differentiating the paths includes identifying those of the paths as straight paths formed of a single line drawn from only one of a command to draw a line from a current specific point to a given specific point, or formed of multiple lines drawn from multiple successive ones of the command in which an angle between a first number of multiple lines and a last number of the multiple lines is less than or equal to a threshold.

13. The method of claim 11, wherein differentiating the paths includes identifying those of the paths as curved paths formed of multiple lines drawn from multiple successive ones of a command to draw a line from a current specific point to a given specific point, in which an angle between a first number of multiple lines and a last number of the multiple lines is greater than a threshold.

14. The method of claim 9, wherein arranging the paths includes:
identifying one of the paths as a first path in the order; and
performing an iterative process to arrange others of the paths after the first path in the order, connected to one another in the vector graphic, a first iteration including:
locating for a current path in the order that in the first iteration is the first path, a connected path in the vector graphic, including iteratively comparing the respective endpoints of the current path with those of others of the paths to identify one of the respective endpoints of the connected path that matches one of the respective endpoints of the current path; and
arranging the connected path after the current path in the order,
wherein in each of at least some iterations of the iterative process after the first iteration, the current path is the connected path located in an immediately preceding iteration.

15. The method of claim 9, wherein generating the circular array of elements includes generating the circular array of elements further including elements for any curved paths in the order in which the paths are arranged, and that indicate those of the paths that are curved paths.

16. The method of claim 9, wherein the vector graphic is disassembled into the paths that include one or more straight paths and one or more curved paths.

17. A computer-readable storage medium for defining a cross section of a structure, the cross section having an arbitrary shape, the computer-readable storage medium being non-transitory and having computer-readable program code stored therein that, in response to execution by processing circuitry, causes an apparatus to at least:
create a vector graphic of the cross section in a two-dimensional (2D) space in which points are specified by numerical coordinates;
disassemble the vector graphic of the cross section into paths that represent an outline of the arbitrary shape of the cross section, each path a straight path or a curved path having respective endpoints including a first endpoint and a second endpoint;
arrange the paths in an order in which the paths are connected in the vector graphic to form the outline of the arbitrary shape of the cross section;

generate a circular array of elements for the paths, including elements for successive pairs of adjacent straight paths in the order in which the paths are arranged, each element indicating for a respective one of the successive pairs, including a first straight path and an adjacent, second straight path, whether the numerical coordinates of the second endpoint of the second straight path are decreasing or increasing with respect to the numerical coordinates of the first endpoint of the first straight path; and
define and thereby produce a definition of the cross section from the circular array of elements.

18. The computer-readable storage medium of claim 17, wherein the apparatus caused to disassemble the vector graphic includes the apparatus caused to remove from the paths, at least one duplicate path that shares the respective endpoints with another of the paths.

19. The computer-readable storage medium of claim 17, wherein the apparatus caused to create the vector graphic includes the apparatus caused to create a computer file having a vector image format in which the vector graphic encoded for storage in the computer file, the vector graphic defined by specific points in the 2D space and commands to draw the paths between the specific points, and
wherein the apparatus caused to disassemble the vector graphic includes the apparatus caused to differentiate the paths as straight paths and any curved paths, based on the specific points and commands by which the vector graphic is defined.

20. The computer-readable storage medium of claim 19, wherein the apparatus caused to differentiate the paths includes the apparatus caused to identify those of the paths as straight paths formed of a single line drawn from only one of a command to draw a line from a current specific point to a given specific point, or formed of multiple lines drawn from multiple successive ones of the command in which an angle between a first number of multiple lines and a last number of the multiple lines is less than or equal to a threshold.

21. The computer-readable storage medium of claim 19, wherein the apparatus caused to differentiate the paths includes the apparatus caused to identify those of the paths as curved paths formed of multiple lines drawn from multiple successive ones of a command to draw a line from a current specific point to a given specific point, in which an angle between a first number of multiple lines and a last number of the multiple lines is greater than a threshold.

22. The computer-readable storage medium of claim 17, wherein the apparatus caused to arrange the paths includes the apparatus caused to at least:
identify one of the paths as a first path in the order; and
perform an iterative process to arrange others of the paths after the first path in the order, connected to one another in the vector graphic, a first iteration including the apparatus caused to:
locate for a current path in the order that in the first iteration is the first path, a connected path in the vector graphic, including iteratively compare the respective endpoints of the current path with those of others of the paths to identify one of the respective endpoints of the connected path that matches one of the respective endpoints of the current path; and
arrange the connected path after the current path in the order, wherein in each of at least some iterations of the iterative process after the first iteration, the current path is the connected path located in an immediately preceding iteration.

23. The computer-readable storage medium of claim 17, wherein the apparatus caused to generate the circular array of elements includes the apparatus caused to generate the circular array of elements further including elements for any curved paths in the order in which the paths are arranged, and that indicate those of the paths that are curved paths.

24. The computer-readable storage medium of claim 17, wherein the apparatus is caused to disassemble the vector graphic into the paths that include one or more straight paths and one or more curved paths.

* * * * *